(12) United States Patent
Zainuddin et al.

(10) Patent No.: US 11,705,206 B2
(45) Date of Patent: Jul. 18, 2023

(54) MODIFYING PROGRAM AND ERASE PARAMETERS FOR SINGLE-BIT MEMORY CELLS TO IMPROVE SINGLE-BIT/MULTI-BIT HYBRID RATIO

(71) Applicant: SanDisk Technologies LLC, Addison, TX (US)

(72) Inventors: Abu Naser Zainuddin, Milpitas, CA (US); Jia Li, San Francisco, CA (US); Jiahui Yuan, Fremont, CA (US); Bo Lei, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 20 days.

(21) Appl. No.: 17/404,217

(22) Filed: Aug. 17, 2021

(65) Prior Publication Data
US 2023/0058038 A1    Feb. 23, 2023

(51) Int. Cl.
*G11C 16/16* (2006.01)
*G11C 16/34* (2006.01)
(Continued)

(52) U.S. Cl.
CPC .......... *G11C 16/16* (2013.01); *G11C 11/5671* (2013.01); *G11C 16/0483* (2013.01);
(Continued)

(58) Field of Classification Search
CPC . G11C 16/16; G11C 16/0483; G11C 16/3445; G11C 16/3459; G11C 16/349
See application file for complete search history.

(56) References Cited

U.S. PATENT DOCUMENTS 7,692,970 B2    4/2010 Park et al.
8,036,044 B2   10/2011 Dong et al.
(Continued)

FOREIGN PATENT DOCUMENTS

CN    104063181 A    9/2014

OTHER PUBLICATIONS

International Search Report and The Written Opinion of the International Searching Authority dated Sep. 13, 2022, International Patent Application No. PCT/US2022/027551.
(Continued)

*Primary Examiner* — Alfredo Bermudez Lozada
(74) *Attorney, Agent, or Firm* — Vierra Magen Marcus LLP

(57) ABSTRACT

Apparatuses and techniques are described for modifying program and erase parameters in a memory device in which memory cells can be operated in a single bit per cell (SLC) mode or a multiple bits per cell mode. In one approach, the stress on a set of memory cells in an SLC mode is reduced during programming and erasing when the number of program-erase cycles for the block in the SLC mode is below a threshold. For example, during programming, the program-verify voltage and program voltages can be reduced to provide a shallower than normal programming. During erasing, the erase-verify voltage can be increased while the erase voltages can be reduced to provide a shallower than normal erase. When the number of program-erase cycles for the block in the SLC mode is above the threshold, the program and erase parameters revert to a default levels.

20 Claims, 21 Drawing Sheets

(51) Int. Cl.
  *G11C 16/04* (2006.01)
  *G11C 11/56* (2006.01)
  *H10B 43/27* (2023.01)

(52) U.S. Cl.
  CPC ........ *G11C 16/349* (2013.01); *G11C 16/3445* (2013.01); *G11C 16/3459* (2013.01); *H10B 43/27* (2023.02)

(56) References Cited

U.S. PATENT DOCUMENTS

| | | |
|---|---|---|
| 9,164,836 B2 | 10/2015 | Guo et al. |
| 9,330,784 B2 | 5/2016 | Pangal et al. |
| 9,418,000 B2 | 8/2016 | Raghunathan et al. |
| 9,842,658 B2 | 12/2017 | Lee |
| 11,049,580 B1 | 6/2021 | Gautam et al. |
| 2009/0034339 A1 | 2/2009 | Eguchi et al. |
| 2009/0122608 A1 | 5/2009 | Aritome |
| 2014/0003156 A1 | 1/2014 | He |
| 2014/0119139 A1 | 5/2014 | Park et al. |
| 2014/0192593 A1 | 7/2014 | Kim |
| 2014/0247666 A1 | 9/2014 | Dutta et al. |
| 2014/0347922 A1* | 11/2014 | Hong ............... G11C 16/3445 365/185.02 |
| 2016/0093397 A1 | 3/2016 | Tabrizi et al. |
| 2019/0244673 A1* | 8/2019 | Yang ..................... G11C 16/14 |
| 2019/0371406 A1* | 12/2019 | Yang .................. G11C 11/5671 |
| 2020/0402582 A1* | 12/2020 | Yang ..................... G06F 3/0679 |

OTHER PUBLICATIONS

English Abstract of Chinese Publication No. CN104063181 published Sep. 24, 2014.

* cited by examiner

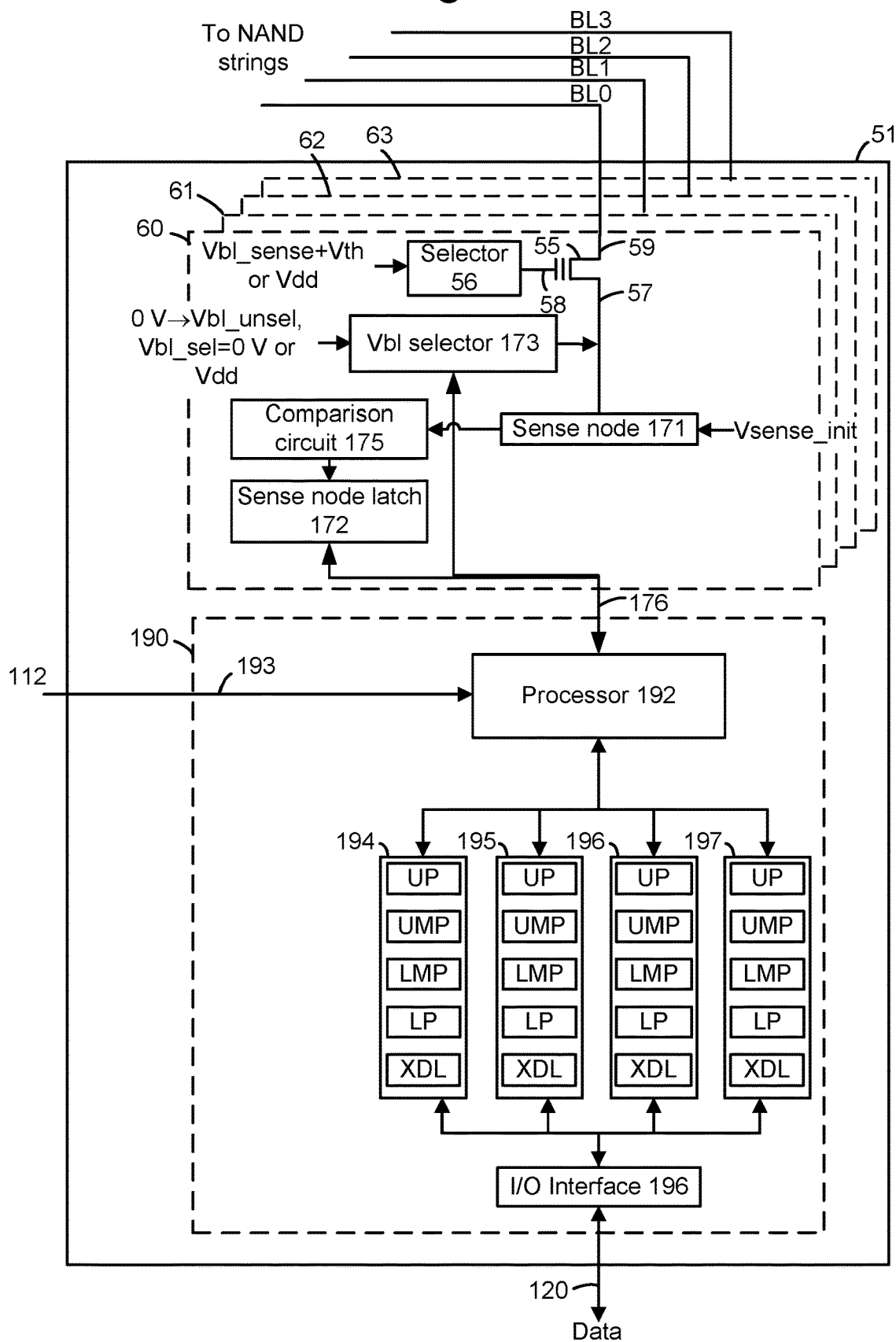

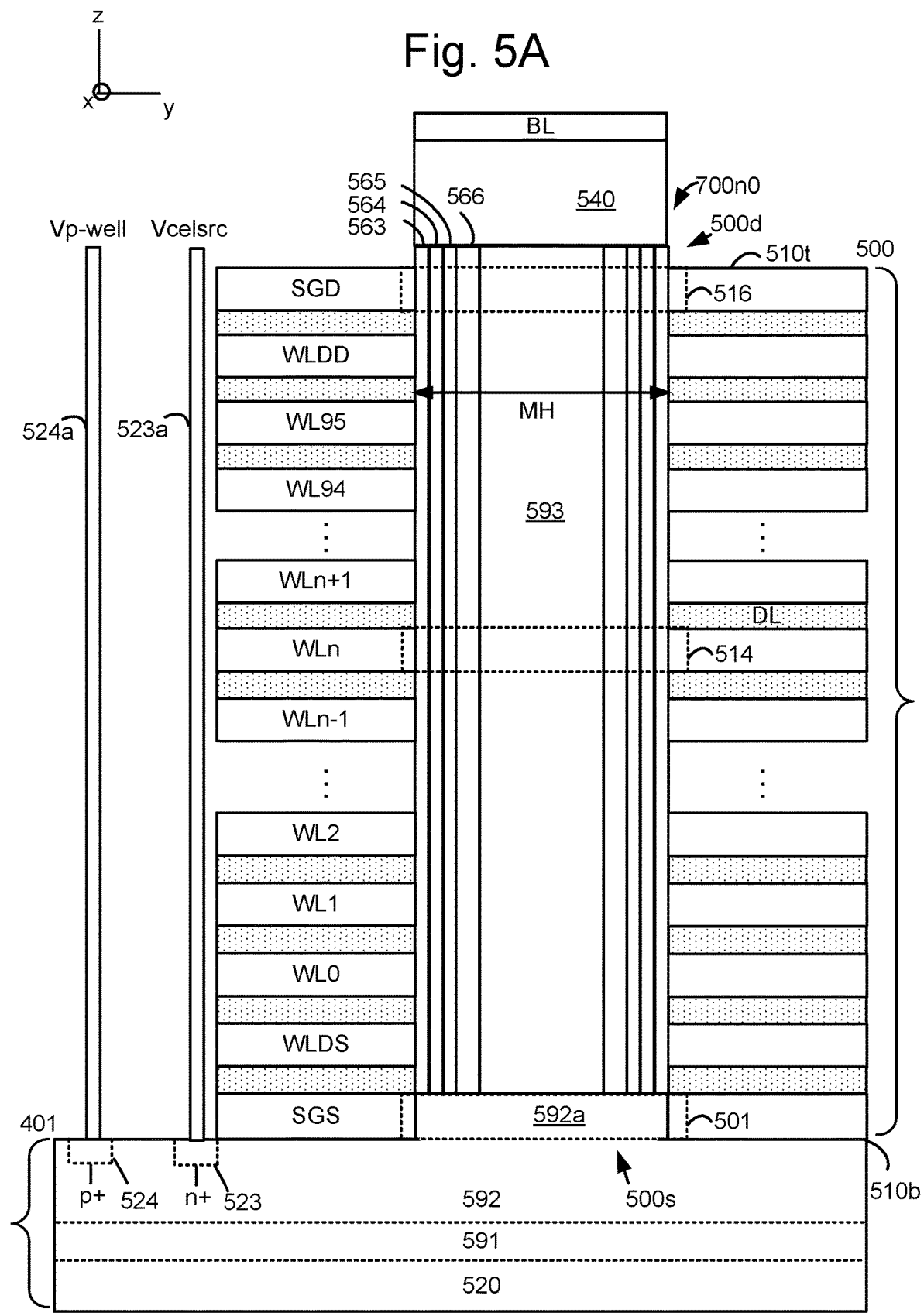

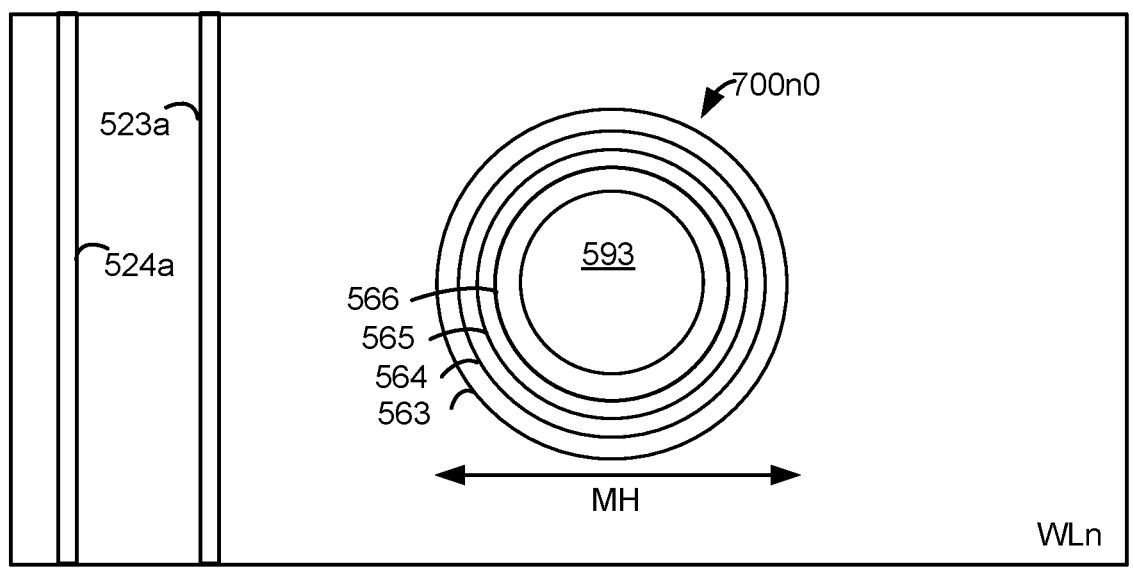

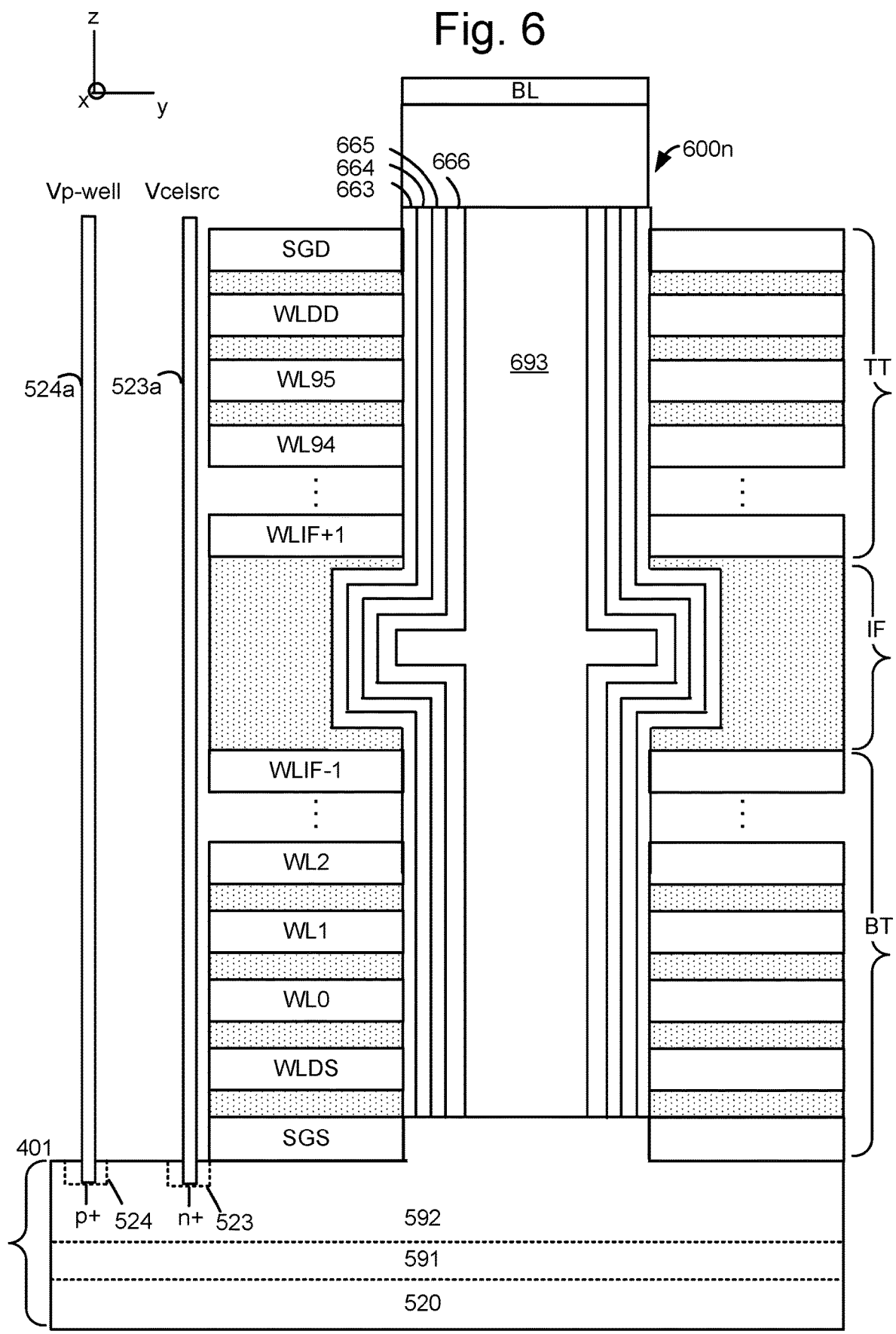

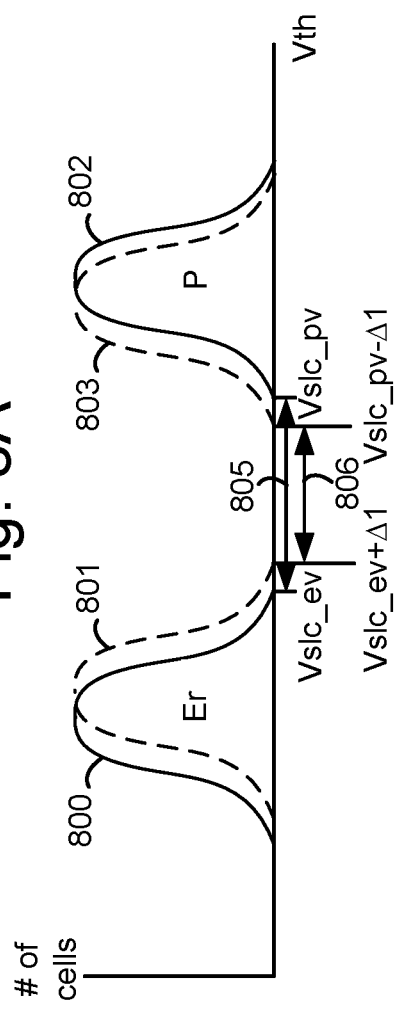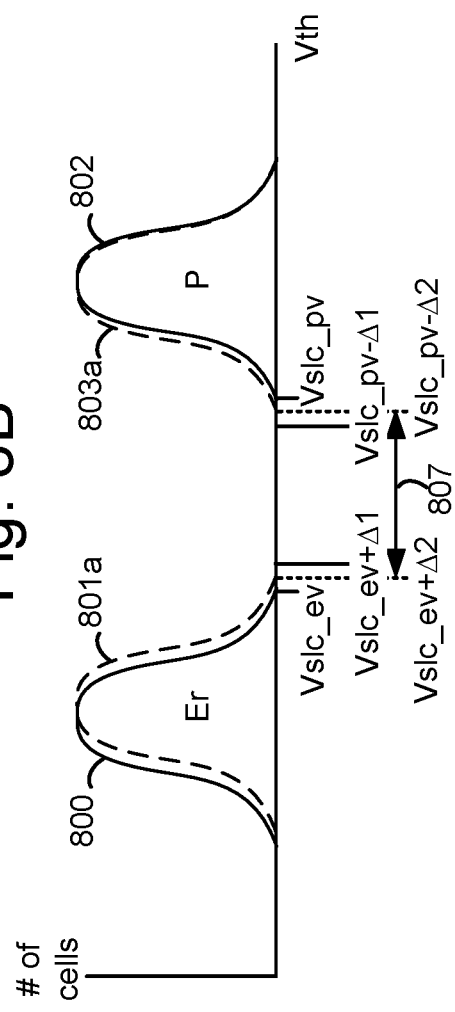

Fig. 11B1

| Parameter:    | Values: | Note:                          |
|---------------|---------|--------------------------------|
| VCG_SLCV      | Base    | program-verify voltage for Plane 0 |
| VCG_SLCV_PB1  | Base    | program-verify voltage for Plane 1 |
| VPGM_SLC      | Base    | initial program voltage        |
| VCG_ERV_SLC   | Base    | erase-verify voltage           |
| VERA_SLC      | Base    | initial erase voltage          |

Fig. 11B2

| Parameter:    | Values:    | Note:                          |
|---------------|------------|--------------------------------|
| VCG_SLCV      | Base-xDAC  | program-verify voltage for Plane 0 |
| VCG_SLCV_PB1  | Base-xDAC  | program-verify voltage for Plane 1 |
| VPGM_SLC      | Base-yDAC  | initial program voltage        |
| VCG_ERV_SLC   | Base+zDAC  | erase-verify voltage           |
| VERA_SLC      | Base-wDAC  | initial erase voltage          |

Fig. 11B3

| Parameter:    | Values: | Note:                          |
|---------------|---------|--------------------------------|
| VCG_MLCV      | Base    | program-verify voltage for Plane 0 |
| VCG_MLCV_PB1  | Base    | program-verify voltage for Plane 1 |
| VPGM_MLC      | Base    | initial program voltage        |
| VCG_ERV_MLC   | Base    | erase-verify voltage           |
| VERA_MLC      | Base    | initial erase voltage          |

Fig. 15A

| Er | P |
|----|---|
| 1  | 0 |

Fig. 15B

| Page | Er | A | B | C |
|------|----|----|----|----|
| UP   | 1  | 0  | 1  | 0  |
| LP   | 1  | 1  | 0  | 0  |

Fig. 15C

| Page | Er | A | B | C | D | E | F | G |
|------|----|----|----|----|----|----|----|----|
| UP   | 1  | 0  | 1  | 0  | 1  | 0  | 1  | 0  |
| MP   | 1  | 1  | 0  | 0  | 1  | 1  | 0  | 0  |
| LP   | 1  | 1  | 1  | 1  | 0  | 0  | 0  | 0  |

Fig. 15D

|     | S0/Er | S1 | S2 | S3 | S4 | S5 | S6 | S7 | S8 | S9 | S10 | S11 | S12 | S13 | S14 | S15 |
|-----|-------|----|----|----|----|----|----|----|----|----|-----|-----|-----|-----|-----|-----|
| UP  | 1     | 0  | 0  | 0  | 0  | 0  | 0  | 0  | 0  | 1  | 1   | 1   | 1   | 1   | 1   | 1   |
| UMP | 1     | 0  | 0  | 0  | 0  | 1  | 1  | 1  | 1  | 0  | 0   | 0   | 0   | 1   | 1   | 1   |
| LMP | 1     | 0  | 0  | 1  | 1  | 0  | 0  | 1  | 1  | 0  | 0   | 1   | 1   | 0   | 0   | 1   |
| LP  | 1     | 1  | 1  | 0  | 1  | 0  | 1  | 0  | 1  | 0  | 1   | 0   | 1   | 0   | 1   | 0   |

MODIFYING PROGRAM AND ERASE PARAMETERS FOR SINGLE-BIT MEMORY CELLS TO IMPROVE SINGLE-BIT/MULTI-BIT HYBRID RATIO

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 2 is a block diagram depicting one embodiment of the sense block 51 of FIG. 1A.

FIG. 5A depicts an example cross-sectional view of a portion of the block B0-0 of FIG. 4, including a NAND string 700n0.

FIG. 5B depicts an example cross-sectional view of the block portion of FIG. 5A in the x-y plane at the level of WLn.

FIG. 6 depicts another example cross-sectional view of a portion of the block B0-0 of FIG. 4, including a NAND string 600n, where the block comprises two tiers.

FIG. 8A depicts example of Vth distributions for a set of SLC memory cells, where verify voltages for the erased state and programmed state can be defined based on two categories of program-erase (P-E) cycles.

FIG. 8B depicts example of Vth distributions for a set of SLC memory cells, where verify voltages for the erased state and programmed state can be defined based on three categories of program-erase (P-E) cycles.

FIG. 11B1 depicts a table of default SLC parameters, consistent with FIG. 11A, step 1105.

FIG. 11B2 depicts a table of modified SLC parameters, consistent with FIG. 11A, step 1104.

FIG. 11B3 depicts a table of default MLC parameters, consistent with FIG. 11A, step 1106.

FIG. 15A depicts an example of latch data during SLC programming, consistent with FIG. 8A or 8B.

FIG. 15B depicts an example of latch data during MLC programming, with four data states, consistent with FIG. 8C.

FIG. 15C depicts an example of latch data during MLC programming, with eight data states, consistent with FIG. 8D.

FIG. 15D depicts an example of latch data during MLC programming, with sixteen data states, consistent with FIG. 8E.

DETAILED DESCRIPTION

Figure 1A:
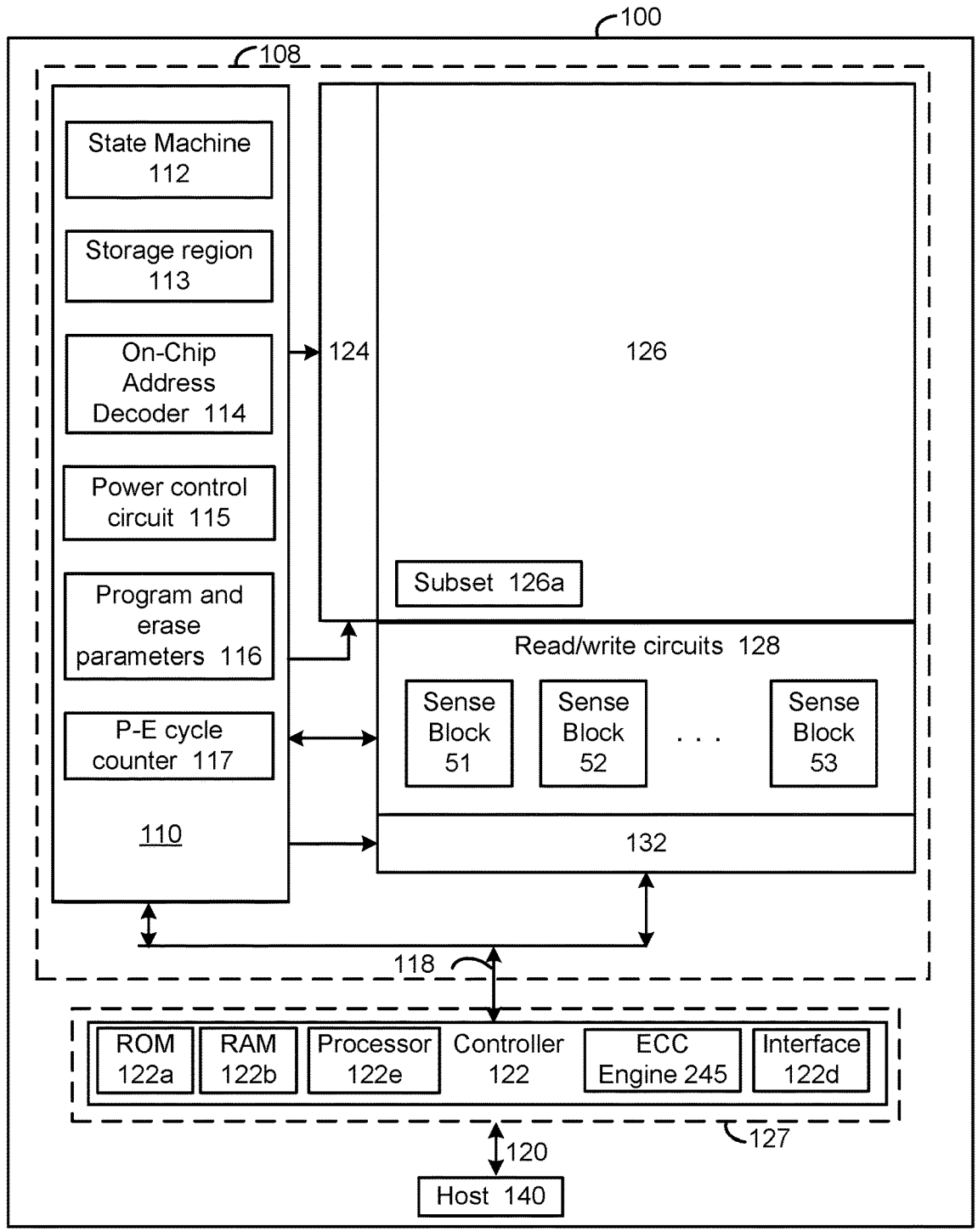
FIG. 1A is a block diagram of an example memory device.

Apparatuses and techniques are described for modifying program and erase parameters in a memory device in which memory cells can be operated in a single bit per cell mode or a multiple bit (multi-bit) per cell mode.

In some memory devices, memory cells are connected to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The select gate transistors are also referred to as select gates. Further, the memory cells can be arranged with a common control gate line (e.g., word line) which acts a control gate. A set of word lines extends from the source-side of a block to the drain-side of a block. Memory cells can be connected in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extends vertically in the stack. A source end of the NAND string is connected to the substrate and a drain end of the NAND string is connected to a bit line.

In particular, 3D NAND flash memory is widely used for storage in consumer devices, enterprise systems and industrial applications because of its non-volatility, affordability, high storage density and high access speed.

In a 2D memory structure, the memory cells may be arranged in horizontal NAND strings on a substrate.

Data can be stored in the memory cells by programming them to different data states which are represented by different ranges of threshold voltages (Vths). In a single bit per cell mode, also referred to as a single level cell (SLC) mode, one bit of data is stored in each memory cell. In a multiple bits per cell mode, also referred to as a multi-level cell (MLC) mode, multiple bits of data are stored in each memory cell. In some cases, memory cells in a block can transition back and forth between the SLC mode and the MLC mode at different times based on the needs of the memory device. The SLC mode provides higher speed programming while the MLC mode provides higher density data storage.

However, programming in the SLC mode can cause more damage to the memory cells than programming in the MLC mode in some cases. For example, traps can form in the tunnel oxide layer of the memory cells, forming a permanent conductive path which renders the memory cell unusable. Damage can occur to other layers as well. The damage is a function of the electric field E across the memory cell.

Due to the greater damage in the SLC mode, the memory device can experience a significant loss of endurance and the ratio of the number of SLC cycles relative to the number of MLC cycles can fall below a desired standard.

Techniques provided herein address the above and other issues. In one approach, the stress on a set of memory cells in an SLC mode is reduced during programming and erasing when the number of SLC program-erase (P-E) cycles is below a threshold. In one approach, the number of P-E cycles is classified into two groups. During programming, the program-verify voltage and program voltages can be reduced to provide a shallower than normal programming. During erasing, the erase-verify voltage can be increased while the erase voltages can be reduced to provide a shallower than normal erase. When the number of program-erase cycles for the block in the single bit per cell mode is above the threshold, the program and erase parameters revert to a default levels.

In one option, the number of P-E cycles is classified into three or more groups and a separate set of program and erase parameters is provided for each group. This can provide three modes, for example: a default or normal program and erase, a first modified program and erase and a second modified program and erase. A Vth window or spacing between the Vth distributions of the erased memory cells and the programmed memory cells is greater during the default program and erase compared to the modified program and erase. Further, a Vth window between the Vth distributions of the erased memory cells and the programmed memory cells is smaller during the first modified program and erase compared to the second modified program and erase.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates.

The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control circuit 115, a storage location 116 for program and erase parameters, and a P-E cycle counter 117. The storage location 116 for program and erase parameters can store modified and default SLC program and erase parameters, and default MLC program and erase parameters. The modified SLC program and erase parameters can be used when the P-E cycles of a block are below a threshold, as discussed herein.

The P-E cycle counter 117 can count SLC and/or MLC P-E cycles for each block to determine when to take a particular action. That is, the P-E cycle counter can, for each block, maintain a first count of program-erase cycles for the block in a single bit per cell mode and a second count of program-erase cycles for the block in a multiple bits per cell mode. For example, when the number of SLC P-E cycles (the first count) is below a threshold, the modified program and erase parameters are used. When the number of SLC P-E cycles does not exceed the threshold, the default program and erase parameters are used.

A storage region 113 may also be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, storage location 116, P-E cycle counter 117, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. For example, see FIG. 9. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. For example, see FIG. 5A. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
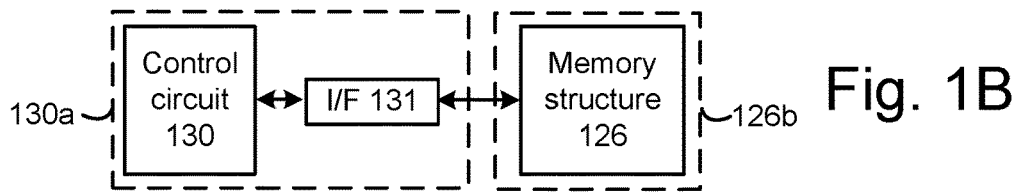
FIG. 1B is a block diagram of an arrangement of the memory device 100 of FIG. 1A in which a control circuit 130 on a first die 130a communicates with the memory structure 126 on a separate second die 126b.

FIG. 1B is a block diagram of an arrangement of the memory device 100 of FIG. 1A in which a control circuit 130 on a first die 130*a* communicates with the memory structure 126 on a separate second die 126*b*. The control circuit may communicate with the memory structure and the die 126*b* via a memory interface 131, for example, similar to the memory interface 122*d*. Examples of a memory interface (I/F) include the Common Flash Memory Interface of JEDEC. The techniques described herein can be implemented with a control die 130*a* bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example. For example, the control circuit can issue commands to the voltage drivers in FIG. 3 to provide the voltage signals described herein.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIG. 7, each bit line is connected to four NAND strings, with one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during an erase-verify test to determine whether a plurality of memory cells have a Vth below a verify voltage. For example, an erase-verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the control gate of the transistor 55 to provide Vbl_sense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits.

During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. For example, in a program-verify test, a 0 can denote fail and a 1 can denote pass. The bit in the sense node latch can be read out in a state bit scan operation of a PCHSEL operation, or flipped from 0 to 1 in an FF fill operation.

The bit in the sense node latch can also be used in a lockout scan to decide whether to set a bit line voltage to an inhibit or program level in a next program loop. The latches 194-197 may be considered to be data state latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of four user data latches, e.g., comprising individual latches LP, LMP, UMP and UP, can be provided for each sense circuit. When a set of memory cells is in a four bit per cell (QLC) mode, LP stores a bit for a lower page of data, LMP stores a bit for a lower-middle page of data, UMP stores a bit for an upper-middle page of data, and UP stores a bit for an upper page of data. In some cases, a different number of data latches may be used. For SLC programming, just one latch per sense circuit may be used, in one approach. The data latches can include a data transfer latch XDL which communicates data to and from the user data latches.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two agree, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

Figure 3:
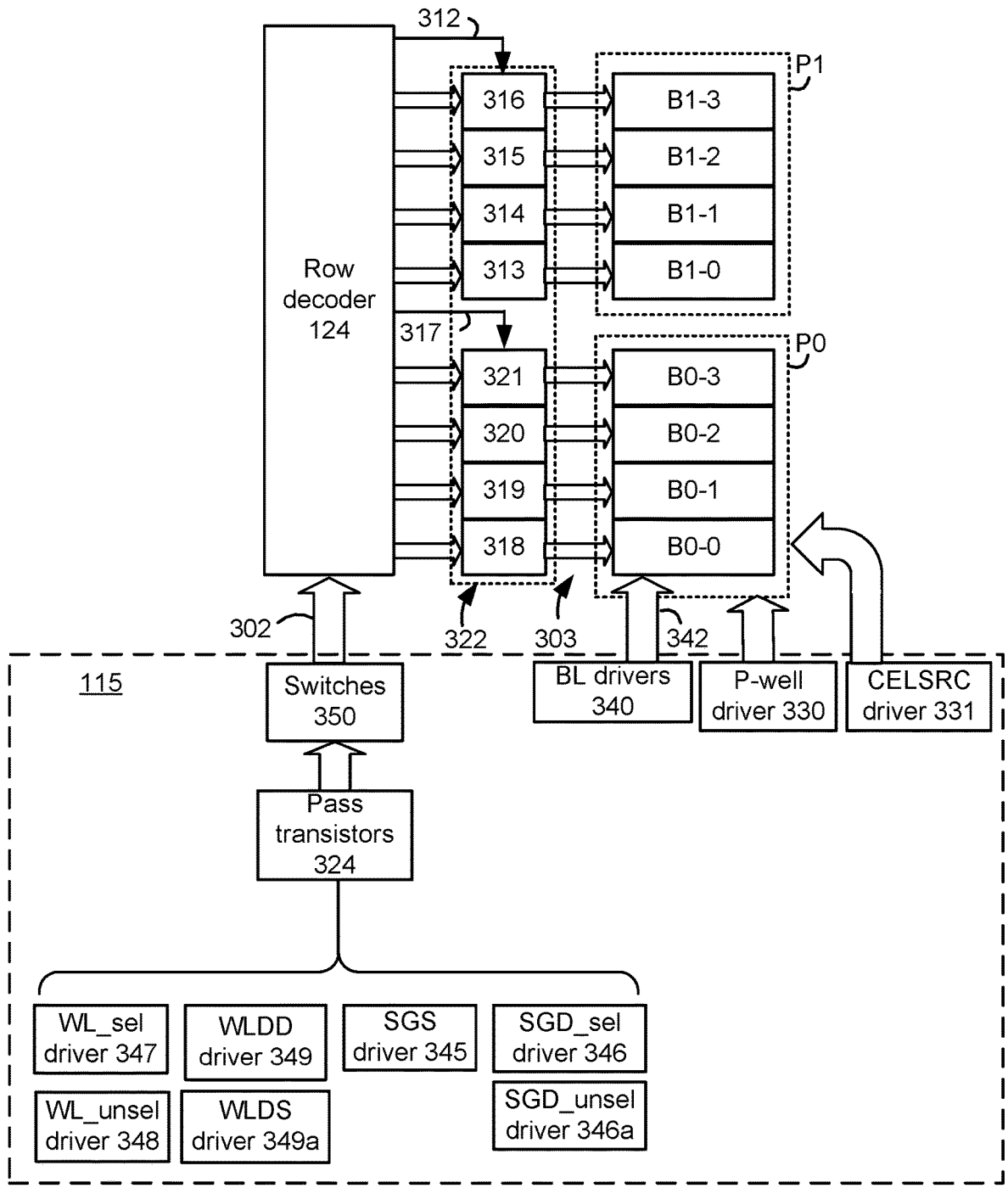
FIG. 3 depicts an example implementation of the power control circuit 115 of FIG. 1A for providing voltages to blocks of memory cells.
Figure 7:
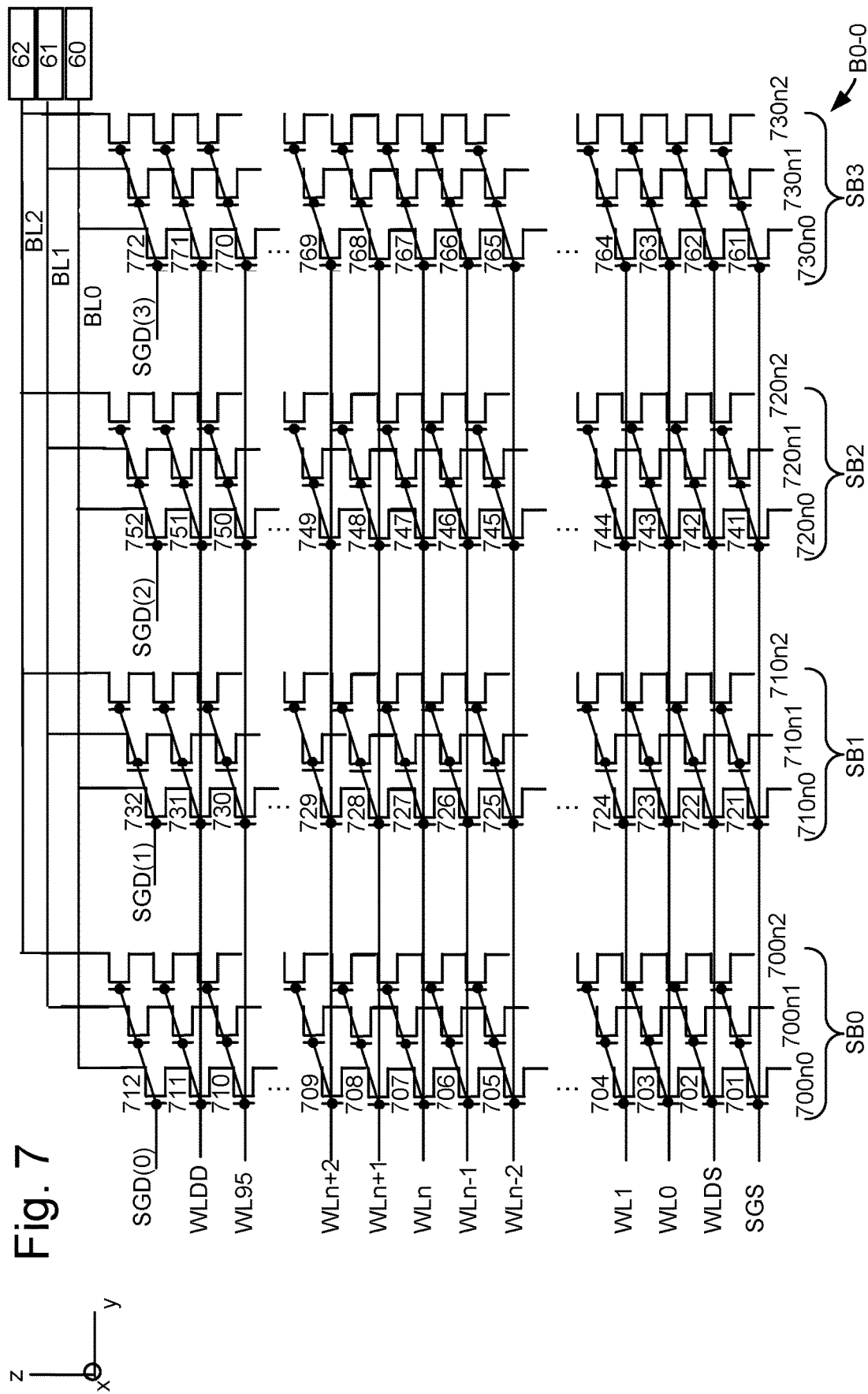
FIG. 7 depicts an example view of the block B0-0 of FIG. 4, with respective NAND strings arranged in sub-blocks, along with associated bit lines and sense circuits.

FIG. 3 depicts an example implementation of the power control circuit 115 of FIG. 1A for providing voltages to blocks of memory cells. The circuitry shown can be repeated for each plane of a die, in one approach. In this example, the memory structure 126 includes a set of four blocks, B0-0 to B0-3, in one plane, P0, and another set of four blocks, B1-0 to B1-3, in another plane, P1, consistent with FIG. 4. Generally, the blocks can be in one or more planes. The row decoder 124 of FIG. 1A provides voltages to word lines and select gate control lines of each block via pass transistors 322. In one approach, a separate row decoder is provided for each block. The row decoder can be provided one side of a block, such as depicted in FIG. 7. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313-316, which in turn are connected to control gate lines of B1-0 to B1-3, respectively. A control gate line 317 is connected to sets of pass transistors 318-321, which in turn are connected to control gate lines of B0-0 to B0-3, respectively.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

A number of voltage drivers can be provided that are connected to the pass transistors. For example, a selected data word line driver, WL_sel driver 347, provides a voltage signal on a data word line which is selected during a program or read operation. The WL_unsel driver 348 provides a voltage signal on unselected data word lines The WLDD driver 349 provides a voltage signal on the drain-side dummy word line, WLDD, and the WLDS driver 349a provides a voltage signal on the source-side dummy word line, WLDS.

The voltage drivers can also include an SGS driver 345 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include a SGD_sel driver 346 for the SGD transistors of a selected sub-block of a block involved in an operation, and a SGD_unsel driver 346a for the SGD transistors of unselected sub-blocks of the block. In another option, a separate SGD driver is provided for each sub-block. The SGD drivers provide a voltage to a control line connected to the control gates of an SGD transistor (drain-side select gate transistor).

The various components, including the row decoder, may receive commands from a controller such as the state machine 112 or the controller 122 to perform the functions described herein.

The p-well voltage driver 330 provides a voltage Vp-well to the p+ contact 524 in the p-well region 592, e.g., via the conductive path 524a. See FIG. 5A. In one approach, the p-well region 592 is common to a set of blocks. A set of bit lines 342 is also shared by the blocks. A source line voltage driver, referred to as a CELSRC driver 331, provides a voltage Vcelsrc to a source end of a NAND string. For example, Vcelsrc can be provided to the n+ contact 523 in the p-well region 592, e.g., via the local interconnect 523a in FIG. 5A.

Bit line (BL) voltage drivers 340 include voltage sources which provide voltages to the bit lines 342. The bit line voltage for sensing can be 0.5 V, for example.

Figure 4:
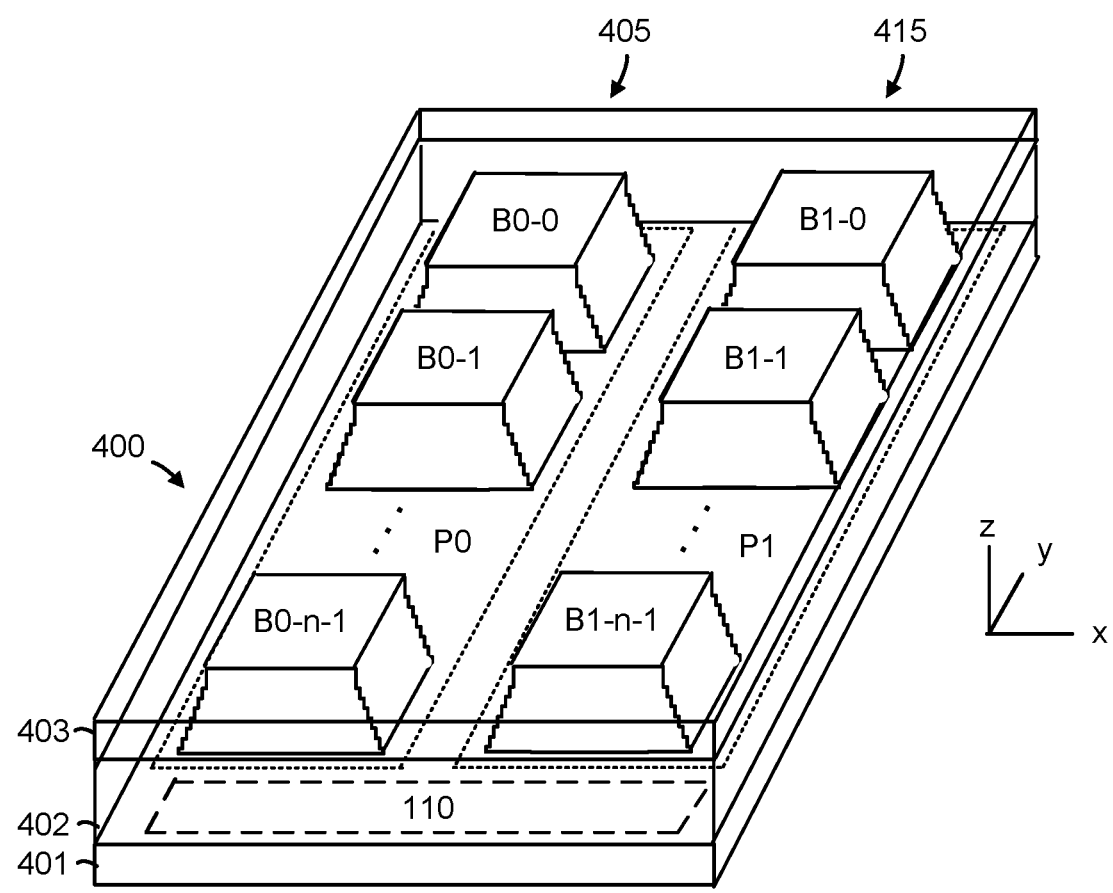
FIG. 4 is a perspective view of an example memory die 400 in which blocks are provided in respective planes P0 and P1, consistent with FIG. 3.

FIG. 4 is a perspective view of an example memory die 400 in which blocks are provided in respective planes P0 and P1, consistent with FIG. 3. The memory die includes a substrate 401, an intermediate region 402 in which blocks of memory cells are formed, and an upper region 403 in which one or more upper metal layers are patterned such as to form bit lines. Planes P0 and P1 represent respective isolation regions which are formed in the substrate 401. Further, a first block sequence 405 of a number n blocks, labelled B0-0 to B0-$n$-1, are formed in P0, and a second block sequence 415 of a number n blocks, labelled B1-0 to B1-$n$-1, are formed in P1. Each plane may have associated row and column control circuitry, such as the row decoder 124, read/write circuits 128 and column decoder 132 of FIG. 1A.

Each block can be set in an SLC or MLC mode at various times based on the needs of the memory device. In some cases, the blocks are divided into groups, and each group comprising multiple blocks is set in an SLC or MLC mode.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in a different planes can be erased concurrently.

The substrate 401 can also carry circuitry under the blocks, and one or more lower metal layers which are patterned in conductive paths to carry signals of the circuitry.

The memory cells can be formed in vertical NAND strings in the blocks, consistent with FIG. 5A. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

FIG. 5A depicts an example cross-sectional view of a portion of the block B0-0 of FIG. 4, including a NAND string 700$n$0. The block comprises a stack 500 of alternating conductive layers (e.g., select gate layers and word line layers) and dielectric layers. The layers may be rectangular plates having a height in the z direction, a width in the y direction, and a length in the x direction. Example conductive layers include SGS, WLDS, WL0, WL1, WL2, . . . , WLn-1, WLn, WLn+1, . . . , WL94, WL95, WLDD and SGD. WLn denotes a selected word line for a read or program operation. The dielectric layers are shown by a dotted pattern and include an example dielectric layer DL. The conductive layers extend in a memory hole MH (see also FIG. 5B). The memory holes can have a varying width.

The stack is depicted as comprising one tier but can optionally include one or more tiers of alternating conductive and dielectric layers. For example, see a stack comprising a bottom tier (BT) and a top tier (TT) in FIG. 6. A stack comprises a set of alternating conductive and dielectric layers in which a memory hole is formed in a fabrication process.

The conductive layers comprise SGS, WLDS, WL0-WL95, WLDD and SGD(0), in addition to 96 data word lines in this example, although the number of data word lines could be greater or less than 96.

The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data.

A top 510t and bottom 510b of the stack are depicted. WL95 is the topmost data word line and WL0 is the bottommost data word line.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 516 is formed where the SGD control line intersects with the multiple thin layers, a source-side select gate transistor 501 is formed where the SGS control line intersects with the multiple thin layers, and a selected memory cell 514 is formed where WLn intersects with the multiple thin layers.

The multiple thin annular layers can be deposited, e.g., using atomic layer deposition. For example, the layers can include a blocking oxide layer 563, a charge-trapping layer 564 or film such as silicon nitride (Si3N4) or other nitride, a tunneling layer 565 (e.g., a gate oxide) and a channel layer 566 (e.g., comprising polysilicon). A dielectric core 593 (e.g., comprising silicon dioxide) can also be provided. In this example, all of the layers are provided in the memory hole. In other approaches, some of the layers can be provided in the word line or control line layer. The multiple thin layers form a columnar active area of a NAND string. A word line or control line can comprise a metal such as Tungsten.

The stack is formed on the substrate 401. In one approach, the substrate includes a p-well region 592 (see also FIG. 3) connected to the source ends of the NAND strings. The p-well region may comprise an epitaxial region 592a which extends upward adjacent to the SGS layer. The p-well region can include an n+ contact 523 connected to a local interconnect 523a (a conductive path or source line) for receiving Vcelsrc, and a p+ contact 524 connected to a conductive path 524a for receiving Vp-well. The local interconnect and conductive path can comprise a conductive material such as metal surrounded by an insulating material to prevent conduction with the metal of the adjacent word lines. The p-well region 592 can be formed in an n-well 591, which in turn is formed in a p-type semiconductor region 520 of the substrate, in one possible implementation.

The NAND string 700n0 has a source end 500s at a bottom 510b of the stack 500, connected to the p-well. The NAND string 500n also has a drain end 500d at a top 510t of the stack, connected to a bit line BL0 via a bit line contact 540 comprising an n-type material.

The NAND string in this 3D configuration is considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate, causing the electrons to return to the channel from the charge trapping layer.

FIG. 5B depicts an example cross-sectional view of the block portion of FIG. 5A in the x-y plane at the level of WLn. The layers of the NAND string 700n0 are depicted, including the blocking oxide layer 563, charge-trapping layer 564, tunneling layer 565 and the channel layer 566. The dielectric core 593 is also depicted.

FIG. 6 depicts another example cross-sectional view of a portion of the block B0-0 of FIG. 4, including a NAND string 600n, where the block comprises two tiers. Like-numbered elements correspond to those in FIG. 5A. A multi-tier stack can be taller and have more layers than a single tier stack, which is limited by the ability to accurately etch a memory hole through multiple layers. In a multi-tier stack, a bottom tier of layers is formed and memory holes are etched. A top tier of layers is then formed on the bottom tier and memory holes are etched in the top tier which align with the memory holes in the bottom tier, to form continuous memory holes which extend through both tiers. Two or more tiers can be used. The top of the memory hole of the first tier tends to be widened at the top, in the IF, to form a base for aligning with the later formed memory hole in the top tier. A NAND string 600n is formed which includes a blocking oxide layer 663, a charge-trapping layer 664, a tunneling layer 665, a channel layer 666, and a dielectric core 693.

In this example, the block comprises a stack of alternating conductive and dielectric layers in two tiers, including a bottom tier BT and a top tier TT. The tiers are separated by an interface (IF) region which is formed of a dielectric material. The word lines include, e.g., WL0 to WLIF−1 in the BT, and WLIF+1 to WL95 in the TT, where WLIF−1 is the word line adjacent to and below the IF, and WLIF+1 is the word line adjacent to and above the IF. For example, when the bottom tier comprises WL0-WL47 and the top tier comprises WL48-WL95, WLIF−1=WL47 and WLIF+1-WL48. Optionally, the word lines adjacent to the IF are allocated as dummy word lines.

Additionally, the height of the IF is greater than the height of the remaining dielectric layers between the word lines. As a result, there is a reduced conductivity in the interface so it is more difficult for the electrons to move through the interface. This configuration can make the memory cells in the top or bottom tier more susceptible to a disturb. In some cases, the position of a memory cell (e.g., the position of a selected word line) within a tier affects the risk of a disturb.

FIG. 7 depicts an example view of the block B0-0 of FIG. 4, with respective NAND strings arranged in sub-blocks, along with associated bit lines and sense circuits. The NAND strings are arranged in sub-blocks of the block in a 3D configuration. The block is consistent with FIG. 5A to 6.

Each sub-block SB0-SB3 includes multiple NAND strings. Three example NAND strings are depicted, as a simplification. For example, SB0 comprises NAND strings 700n0, 700n1 and 700n2, SB1 comprises NAND strings 710n0, 710n1 and 710n2, SB2 comprises NAND strings 720n0, 720n1 and 720n2, and SB3 comprises NAND strings 730n0, 730n1 and 730n2. The NAND strings have data word lines, dummy word lines and select gate lines. Each sub-block comprises a set of NAND strings which extend in the x direction and which have a common SGD line or control gate layer. In particular, SGD(0)-SGD(3) are in SB0-SB3, respectively.

Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line and end at WL95, the drain end word line, for example.

Different sub-blocks can also have different susceptibilities to program or read disturbs due to other factors such as different distances from the row decoder and the corresponding different RC delays of a word line voltage signal.

Reading can occur for memory cells connected to a selected word line in a selected sub-block. Reading can occur one sub-block at a time.

In an erase operation, typically the entire block is erased, although a partial block erase is also possible.

Each NAND string comprises a plurality of memory cells between an SGS transistor and a SGD transistor, in this example. In other examples, more than one SGD and/or SGS transistor can be provided for each NAND string. The number of dummy memory cells can also vary. For example, the NAND string 700n0 includes an SGS transistor 701, a dummy memory cell 702, data memory cells 703-710, a dummy memory cell 711 and an SGD transistor 712. The NAND string 710n0 includes an SGS transistor 721, a dummy memory cell 722, data memory cells 723-730, a dummy memory cell 731 and an SGD transistor 732. The NAND string 720n0 includes an SGS transistor 741, a dummy memory cell 742, data memory cells 743-750, a dummy memory cell 751 and an SGD transistor 752. The NAND string 730n0 includes an SGS transistor 761, a dummy memory cell 762, data memory cells 763-770, a dummy memory cell 771 and an SGD transistor 772.

This example depicts one SGD transistor at the drain end of each NAND string, and one SGS transistor at the source end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

A set of bit lines, including example bit lines BL0-BL2, are connected to the NAND strings. Each bit line is connected to a respective set of NAND strings, including one NAND string in each sub-block. For example, BL0 is connected to NAND strings 700n0, 710n0, 720n0 and 730n0 in SB0-SB3, respectively, BL1 is connected to NAND strings 700n1, 710n1, 720n1 and 730n1 in SB0-SB3, respectively, and BL2 is connected to NAND strings 700n2, 710n2, 720n2 and 730n2 in SB0-SB3, respectively. Each bit line is also connected to a respective sense circuit, consistent with the sense circuits of FIG. 2. For example, BL0-BL2 are connected to sense circuits 60-62, respectively.

The row decoder 124 is at one side of the block in this example, in a peripheral area of the substrate, consistent with the control circuitry 110 depicted in FIG. 4. The row decoder routes voltage signals to the word lines, as discussed. In one approach, the conductive paths extend vertically in the z direction to the upper region 403, then horizontally in the y direction and then vertically down in the −z direction in vias which contact the word lines. The side of the block may have a stair step shape in which the vias can contact an edge of each word line. In this example, it is assumed that the stair step shape is closest to SB0. As a result, the RC delay of a word line voltage signal will be smallest for SB0 and largest for SB3. The distance between the row decoder and the sub-blocks is considered to increase progressively for SB0-SB3.

In FIG. 8A-8E, the vertical axis depicts a number of memory cells on a logarithmic scale and the horizontal axis depicts Vth on a linear scale.

FIG. 8A depicts example of Vth distributions for a set of SLC memory cells, where verify voltages for the erased state and programmed state can be defined based on two categories of program-erase (P-E) cycles. When default program and erase parameters are used, the erased (Er) state is represented by the Vth distribution 800, and the programmed state (P) is represented by the Vth distribution 802. The Er state is obtained by using a default erase-verify voltage, Vslc_ev, and the P state is obtained using a default program-verify voltage, Vslc_pv. A window of Vslc_pv−Vslc_ev between the two Vth distributions is represented by the arrow 805 and separates the upper tail of the Er state from the lower tail of the P state.

When modified program and erase parameters are used, the Er state is represented by the Vth distribution 801, and the P state is represented by the Vth distribution 803. The Er state is obtained by using a modified erase-verify voltage, Vslc_ev+$\Delta$1>Vslc_ev, and the P state is obtained using a modified program-verify voltage, Vslc_pv−$\Delta$1<Vslc_pv. A window of (Vslc_pv−$\Delta$1−Vslc_ev+$\Delta$1)<(Vslc_pv−Vslc_ev) between the two Vth distributions 801 and 803 is represented by the arrow 806. In this example, both the program and erase verify voltages are modified to provide a shallower program and erase. In another approach, just one of these verify voltages is modified. It is also possible to modify one of the verify voltages (e.g., the program-verify voltage or the erase-verify voltage, but not both) when the number of P-E cycles is in a first group, e.g., 1,001-2,000 cycles, and to modify another of the verify voltages (e.g., both the program-verify voltage and the erase-verify voltage) when the number of P-E cycles is in a second group, e.g., 0-1,000 cycles, representing a smaller number of cycles. Further, the modification in the erase-verify voltage can be equal to, or different than, the modification in the program-verify voltage.

During an erase operation, the Vth of the memory cells is set below the erase-verify voltage. The erase operation is completed when all or nearly all of the memory cells have a Vth below this voltage. During the program operation, the Vth of the memory cells is set above a program-verify voltage. The program operation is completed when all or nearly all of the memory cells have a Vth above this voltage.

The programming is shallower (to a lower Vth) when the modified program parameters are used compared to when the default program parameters are used. The erasing is shallower (to a higher Vth) when the modified erase parameters are used compared to when the default erase parameters are used.

FIG. 8B depicts example of Vth distributions for a set of SLC memory cells, where verify voltages for the erased state and programmed state can be defined based on three categories of program-erase (P-E) cycles. The first category can be the lowest number of P-E cycles, e.g., 0-1,000 cycles and the second category can be the second lowest number of P-E cycles, e.g., 1,001-2,000 cycles. The third category is 2,001 or more cycles. As before, when the default program and erase parameters are used, the Er state is represented by the Vth distribution 800, and the P state is represented by the Vth distribution 802.

When first modified program and erase parameters are used, the Er state is represented by the Vth distribution 801, and the P state is represented by the Vth distribution 803 as depicted in FIG. 8A. The Er state is obtained by using a first modified erase-verify voltage, Vslc_ev+Δ1, and the P state is obtained using a first modified program-verify voltage, Vslc_pv−Δ1.

When second modified program and erase parameters are used, the Er state is represented by the Vth distribution 801*a*, and the P state is represented by the Vth distribution 803*a*. The Er state is obtained by using a second modified erase-verify voltage, Vslc_ev+Δ2<Vslc_ev+Δ1, and the P state is obtained using a second modified program-verify voltage, Vslc_pv−Δ2>Vslc_pv−Δ1. A window of (Vslc_pv−Δ2−Vslc_ev+Δ2)>(Vslc_pv−Δ1−Vslc_ev+Δ1) between the two Vth distributions 801*a* and 803*a* is represented by the arrow 807.

The programming is shallower (to a lower Vth) when the first modified program parameters are used compared to when the second modified program parameters are used. The erasing is shallower (to a higher Vth) when the first modified erase parameters are used compared to when the second modified erase parameters are used.

Figure 8C:
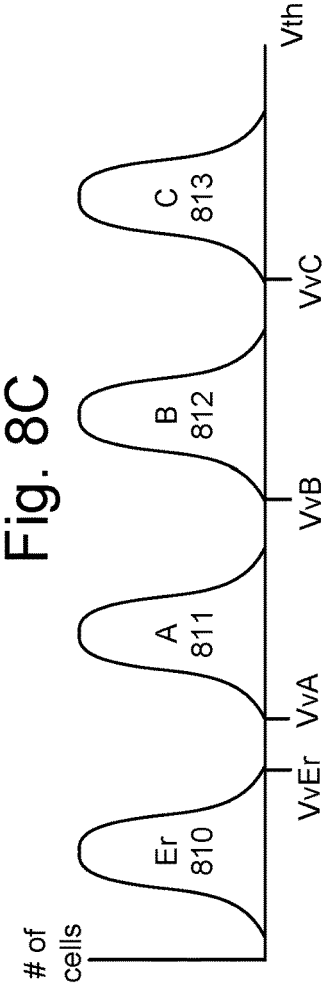
FIG. 8C depicts an example Vth distribution for a set of MLC memory cells with four data states.

FIG. 8C depicts an example Vth distribution for a set of MLC memory cells with four data states. In this case, each memory cell stores two bits of data. The data states include the erased state Er having an associated erase-verify voltage VvEr, and the programmed states A-C having associated program-verify voltages VvA-VvC, respectively. The data states Er-C are represented by the Vth distributions 810-813, respectively.

Figure 8D:
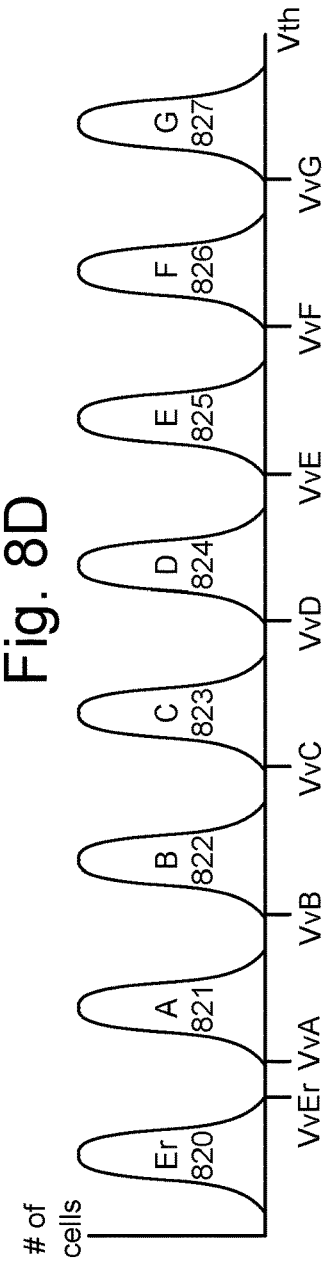
FIG. 8D depicts an example Vth distribution for a set of MLC memory cells with eight data states.

FIG. 8D depicts an example Vth distribution for a set of MLC memory cells with eight data states. In this case, each memory cell stores three bits of data. The data states include the erased state Er having an associated erase-verify voltage VvEr, and the programmed states A-G having associated program-verify voltages VvA-VvG, respectively. The data states Er-G are represented by the Vth distributions 820-827, respectively.

Figure 8E:
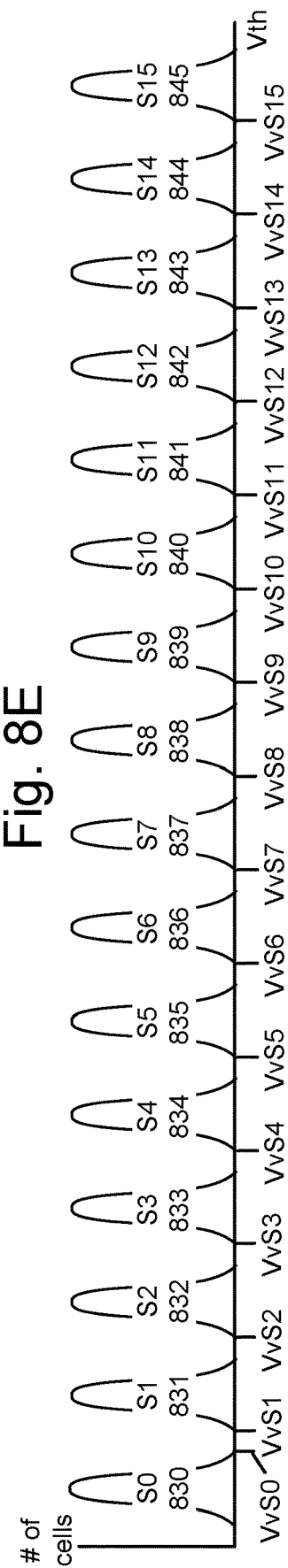
FIG. 8E depicts an example Vth distribution for a set of MLC memory cells with sixteen data states.

FIG. 8E depicts an example Vth distribution for a set of MLC memory cells with sixteen data states. In this case, each memory cell stores four bits of data. The data states include the erased state S0 having an associated erase-verify voltage VvS0, and the programmed states S1-S15 having associated program-verify voltages VvS1-VvS15, respectively. The data states S0-S15 are represented by the Vth distributions 830-845, respectively.

Figure 14:
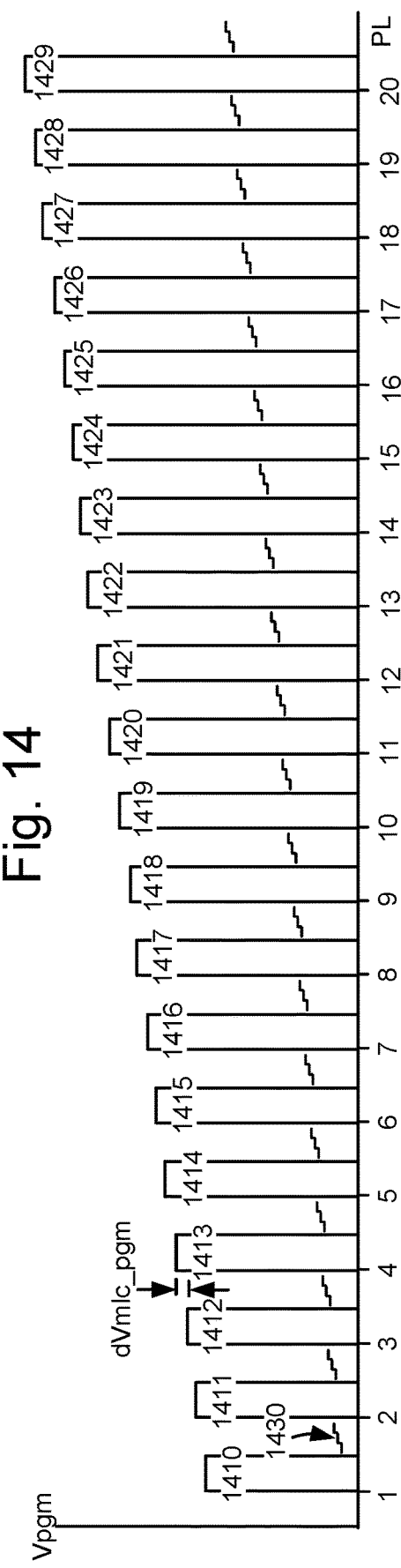
FIG. 14 depicts an example voltage signal 1450 in an MLC program operation, consistent with FIG. 11A, step 1106.

A voltage signal 1450 such as depicted in FIG. 14 can be used to program the memory cells. Typically, several program loops are used to obtain the Vth distributions. When a memory cell is verified to reach its assigned data state, it is inhibited from programming in the remaining program loops by applying an elevated bit line voltage to the respective NAND string during the program pulses of the remaining program loops. The verify tests in the program loops can be set for progressively higher data states as the program operation proceeds.

Figure 9B:
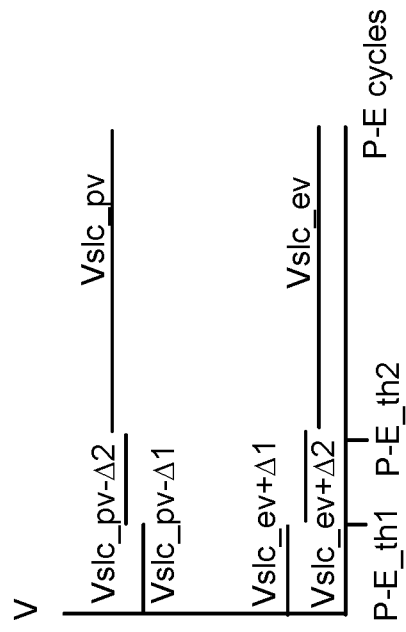
FIG. 9B depicts a plot of verify voltage versus P-E cycles, consistent with FIG. 8B.
Figure 9A:
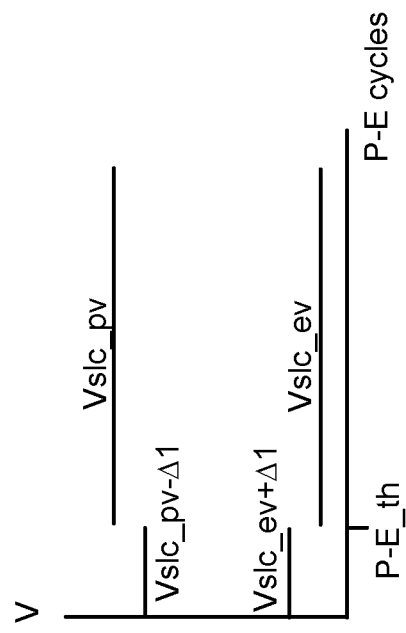
FIG. 9A depicts a plot of verify voltage versus P-E cycles, consistent with FIG. 8A.

FIG. 9A depicts a plot of verify voltage versus P-E cycles, consistent with FIG. 8A. When the number of SLC P-E cycles is below a (first) threshold, P-E_th, the program-verify voltage is Vslc_pv−Δ1 and the erase verify voltage is Vslc_ev+Δ1. When the number of SLC P-E cycles is at or above P-E_th, the program-verify voltage is Vslc_pv and the erase verify voltage is Vslc_ev. P-E_th can be set to represent when the memory device is relatively fresh and has a relatively smaller number of P-E cycles. For example, P-E_th can represent no more than 1-5% of the number of SLC P-E cycles of a block's lifetime, e.g., 100,000 cycles. The lifetime is a specified minimum goal of P-E cycles which a block should reach in the hands of the end user. As a result, the stress on the memory cells is reduced at a time when they are most susceptible to damage. At other times, when the memory cells are less susceptible to damage, the block operates using the default parameters so there is no penalty in terms of Vth window or program time.

FIG. 9B depicts a plot of verify voltage versus P-E cycles, consistent with FIG. 8B. When the number of SLC P-E cycles is below a first threshold, P-E_th1, the program-verify voltage is Vslc_pv−Δ1 and the erase verify voltage is Vslc_ev+Δ1. When the number of SLC P-E cycles is between the first threshold, P-E_th1, and a second threshold, P-E_th2, the program-verify voltage is Vslc_pv−Δ2 and the erase verify voltage is Vslc_ev+Δ2. When the number of SLC P-E cycles is at or above P-E_th2, the program-verify voltage is Vslc_pv and the erase verify voltage is Vslc_ev. For example, P-E_th1 can represent no more than 1-3% of the number of SLC P-E cycles of a block's lifetime and P-E_th2 can represent no more than 5-6% of the number of SLC P-E cycles of the block's lifetime.

As a result, the stress on the memory cells is significantly reduced at a time when they are most susceptible to damage and moderately reduced at a time when they are moderately susceptible to damage. At other times, when the memory cells are least susceptible to damage, the block operates using the default parameters.

Figure 10A:
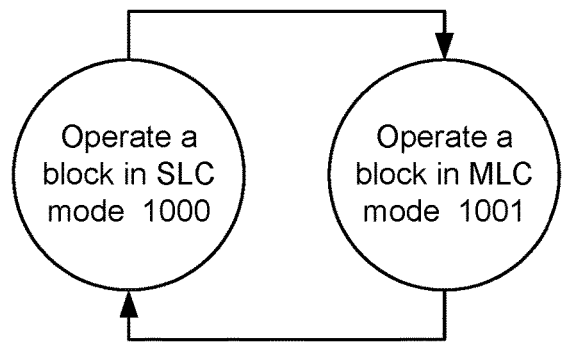
FIG. 10A depicts a diagram showing a transition of a block between an SLC mode and an MLC mode during its lifetime.

FIG. 10A depicts a diagram showing a transition of a block between an SLC mode and an MLC mode during its lifetime. As mentioned, memory cells in a block can transition back and forth between the SLC mode and the MLC mode according to the needs of the memory device. The SLC mode provides higher speed programming while the MLC mode provides higher density data storage. The circle 1000 denotes operating a block of memory cells in the SLC mode and the circle 1001 denotes operating the block of memory cells in the MLC mode. In some cases, the memory device attempts to equalize the number of SLC P-E cycles among the different blocks. The memory device can also attempt to equalize a ratio between the number of SLC P-E cycles and the number of MLC P-E cycles among the different blocks.

Figure 10B:
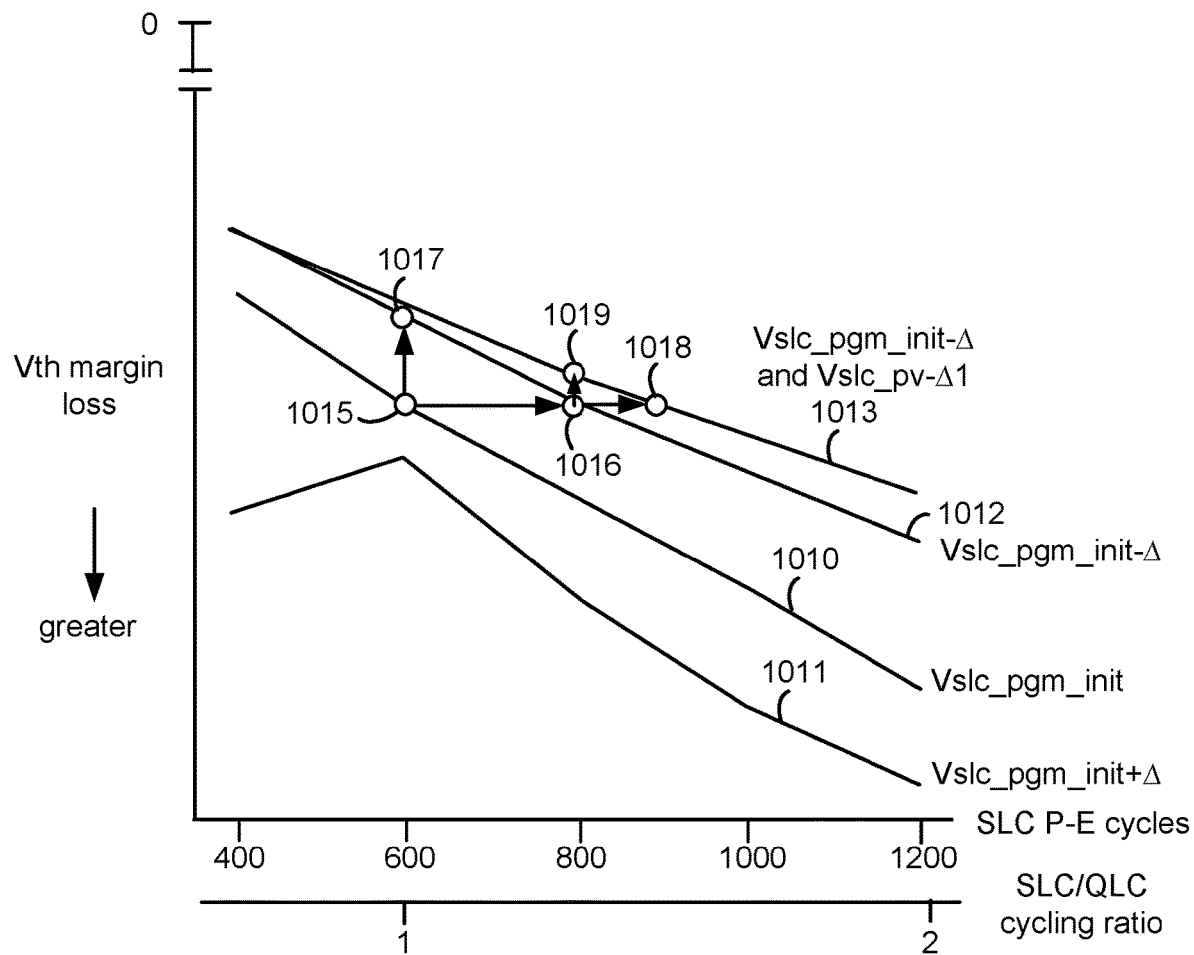
FIG. 10B depicts a plot of Vth margin loss for SLC memory cells vs. a number of P-E cycles and a cycling ratio.

FIG. 10B depicts a plot of Vth margin loss for SLC memory cells vs. a number of P-E cycles and a cycling ratio. The first horizontal axis depicts SLC P-E cycles. The second horizontal axis depicts an SLC/QLC cycling ratio, which represents a number of SLC P-E cycles for a block or other set of memory cells divided by a number of QLC cycles for the block. QLC refers to four bits per cell as one example of an MLC mode. In this example, there are 600 QLC P-E cycles, and the number of SLC P-E cycles ranges from 400-1200 cycles. The plots indicate that the Vth margin loss generally increases as the number of P-E cycles increases. This is due to damage to the memory cells, such as the accumulation of traps at the interface between the tunneling layer and the polysilicon channel layer.

Plot 1010 depicts the case of SLC programming with a default or baseline program pulse magnitude (such as Vslc_pgm_init in FIG. 12B) in the initial program loop and a default program-verify voltage (such as Vslc_pv in FIG. 8A). Plot 1011 depicts the case of SLC programming with a higher than default program pulse magnitude (Vslc_pgm_init+Δ) in the initial program loop and the default program-verify voltage. Plot 1012 depicts the case of SLC programming with a lower than default program pulse magnitude (such as Vslc_pgm_init−Δ in FIG. 12A) in the initial program loop and the default program-verify voltage.

A data point 1015 depicts a case of QLC programming with 600 P-E cycles, or a SLC/QLC cycling ratio=1. The horizontal arrow pointing to the data point 1016 from the data point 1015 show that for a fixed Vth margin loss, the number of SLC P-E cycles can be increased to about 800 by using the lower than default initial program pulse magnitude. Note that the initial program pulse magnitude could have a lower than default duration, together with or separate from a lower than default magnitude.

Similarly, the vertical arrow pointing to the data point 1017 from the data point 1015 show that for a fixed number of SLC P-E cycles, the Vth margin loss can be reduced by using a lower than default initial program pulse magnitude and/or duration in SLC programming. This data indicates Vth margin loss is reduced when the initial program pulse magnitude and/or duration is reduced in the initial program loop of an SLC program operation.

Plot 1013 depicts the case of SLC programming with a lower than default program pulse magnitude (such as Vslc_pgm_init−Δ in FIG. 12A) in the initial program loop and a lower than default program-verify voltage (such as Vslc_pv−Δ1 in FIG. 8A). A default program-verify voltage (such as Vslc_pv in FIG. 8A) is used for plots 1010-1012. The plot indicates that lowering the program-verify voltage advantageously results in an increase in the number of SLC P-E cycles (data point 1018) and/or a reduction in the Vth margin loss (data point 1019).

A reduction in the magnitude and/or duration of the erase voltage, and/or a higher than default erase-verify voltage are expected to yield similar improvements in the number of SLC P-E cycles and the Vth margin loss.

Figure 11A:
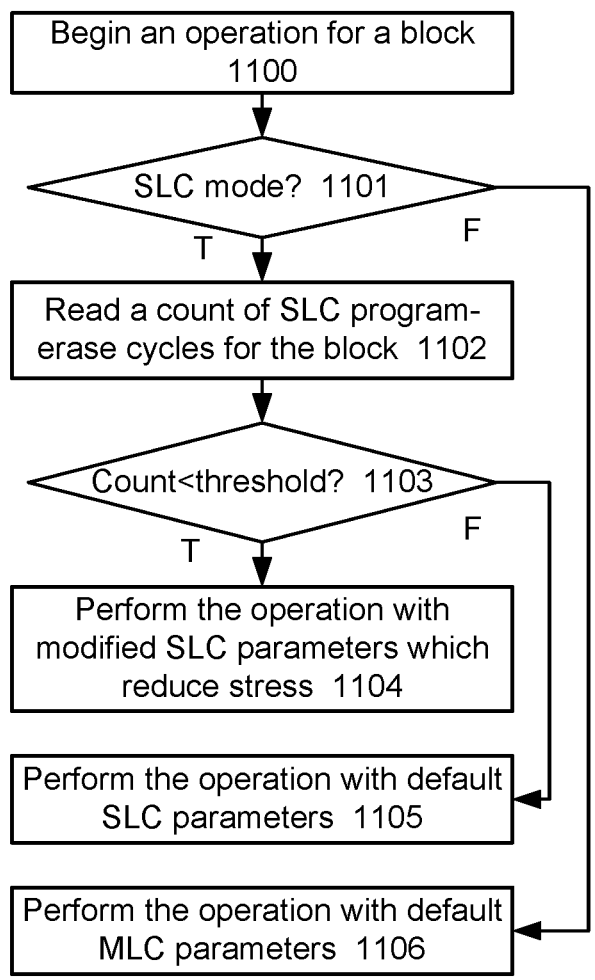
FIG. 11A depicts a flowchart of an example operation for SLC memory cells, consistent with FIGS. 8A and 9A.

FIG. 11A depicts a flowchart of an example operation for SLC memory cells, consistent with FIGS. 8A and 9A. The operation can be performed in a device mode of the memory device. Step 1100 begins an operation (e.g., programming or erasing) for a block of memory cells. A decision step 1101 determines whether the block is in an SLC mode. If the decision step 1101 is true (T), step 1102 reads a count of SLC program-erase cycles for the block. For example, the P-E cycle counter 117 of FIG. 1A may be used for this purpose. A decision step 1103 determines whether the count is less than a threshold such as P-E_th in FIG. 9A or P-E_th1 or P-E_th2 in FIG. 9B. If the decision step 1103 is true, step 1104 performs the operation with modified SLC parameters which reduce stress on the memory cells. If the decision step 1103 is false, step 1105 performs the operation with default SLC parameters. If the decision step 1101 is false (F), the block is in an MLC mode, and step 1106 performs the operation with default MLC parameters.

FIG. 11B1 depicts a table of default SLC parameters, consistent with FIG. 11A, step 1105. As mentioned, the parameters for a program operation can include an initial program voltage, a step size of the program voltages and a program-verify voltage. The parameters for an erase operation can include an initial erase voltage, a step size of the erase voltages and an erase-verify voltage. Additionally, the parameters can be the same or different for different blocks and/or for different planes in a memory device. The example set of parameters in FIG. 11B1 includes: VCG_SLCV, a program-verify voltage for Plane 0, VCG_SLCV_PB1, a program-verify voltage for Plane 1, VPGM_SLC, an initial program voltage, VCG_ERV_SLC, an erase-verify voltage and VERA SLC, an initial erase voltage. The values are all set to respective base or default values.

FIG. 11B2 depicts a table of modified SLC parameters, consistent with FIG. 11A, step 1104. The example set of parameters includes VCG_SLCV, a program-verify voltage for Plane 0 having a value of base−xDAC. VCG_SLCV_PB1, a program-verify voltage for Plane 1 has a value of base−xDAC. VPGM_SLC, an initial program voltage has a value of base−yDAC. VCG_ERV_SLC, an erase-verify voltage has a value of base+zDAC. VERA SLC, an initial erase voltage has a value of base−wDAC. xDAC, yDAC, zDAC and wDAC represent different output voltages of a digital-to-analog converter.

FIG. 11B3 depicts a table of default MLC parameters, consistent with FIG. 11A, step 1106. The example set of parameters includes: VCG_MLCV, a program-verify voltage for Plane 0, VCG_MLCV_PB1, a program-verify voltage for Plane 1, VPGM_MLC, an initial program voltage, VCG_ERV_MLC, an erase-verify voltage, and VERA_MLC, an initial erase voltage. The values are all set to respective base or default values.

Figure 11C:
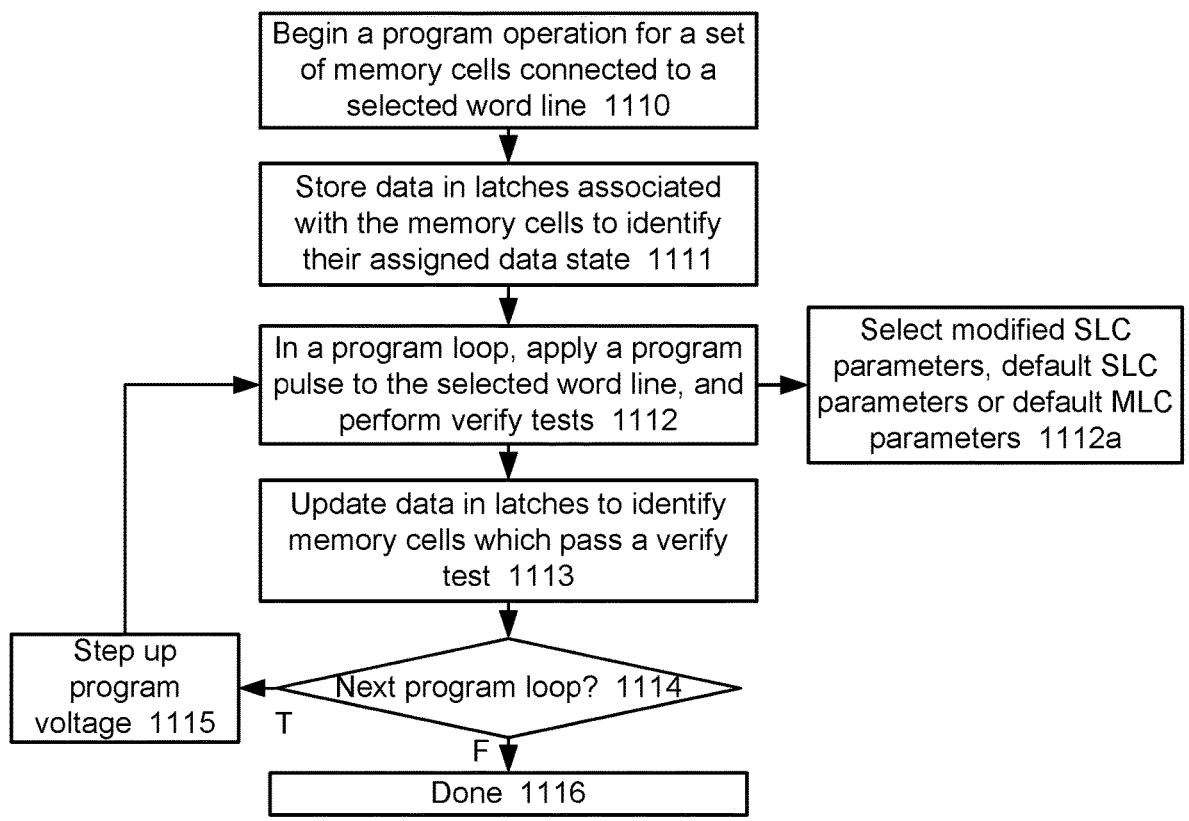
FIG. 11C depicts a flowchart of an example program operation for memory cells, consistent with FIG. 11A.

FIG. 11C depicts a flowchart of an example program operation for memory cells, consistent with FIG. 11A. Step 1110 begins a program operation for a set of memory cells connected to a selected word line. Step 1111 includes storing data in latches associated with the memory cells to identify their assigned data state, e.g., Er or P. See the latches of FIG. 2, for example. Step 1112 includes, in a program loop, applying a program pulse to the selected word line, and performing associated verify tests. This step can include step 1112a which includes selecting modified SLC parameters, default SLC parameters or default MLC parameters. Step 1113 includes updating data in the latches to identify memory cells which pass a verify test. For example, a latch can be flipped from 0 to 1.

A decision step 1114 determines whether a next program loop is needed in the program operation. When the decision step is true, e.g., when programming is not yet completed for all or nearly all of the memory cells, step 1115 steps up the program voltage and step 1112 follows for a further program loop. When the decision step 1114 is false, the program operation is done at step 1116.

Figure 11D:
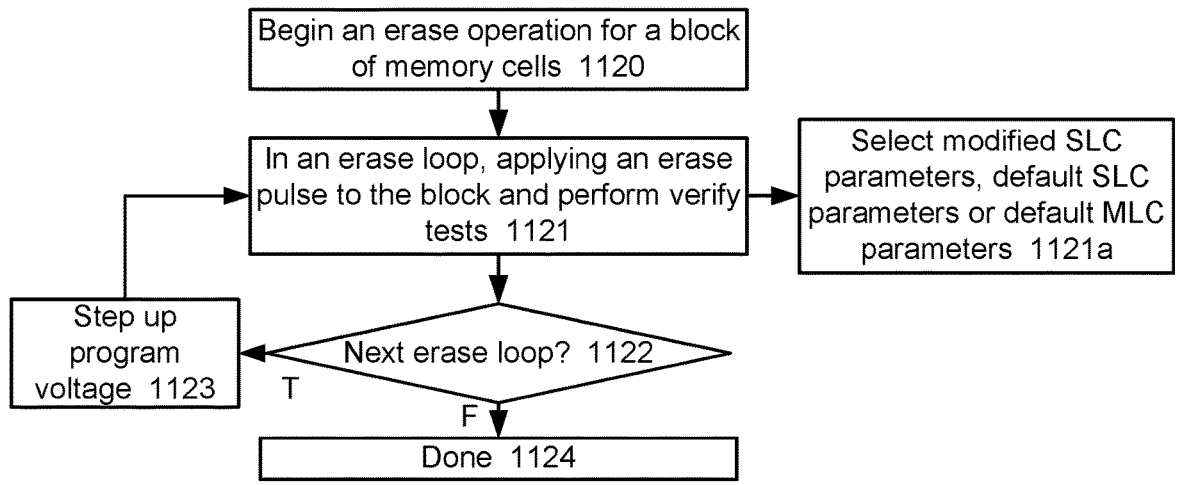
FIG. 11D depicts a flowchart of an example erase operation for memory cells, consistent with FIG. 11A.

FIG. 11D depicts a flowchart of an example erase operation for memory cells, consistent with FIG. 11A. Step 1120 begins an erase operation for a block of memory cells. Step 1121 includes, in a erase loop, applying a erase pulse to the block, and performing associated verify tests. This step can include step 1121a which includes selecting modified SLC parameters, default SLC parameters or default MLC parameters.

A decision step 1122 determines whether a next erase loop is needed in the erase operation. When the decision step is true, e.g., when erasing is not yet completed for all or nearly all of the memory cells, step 1123 steps up the erase voltage and step 1121 follows for a further erase loop. When the decision step 1122 is false, the erase operation is done at step 1124.

In this process, the set of memory cells in a block is erased to a depth which is a function of whether the number of P-E cycles of the block is less than a threshold, when the memory cells are in a single bit per cell mode. The depth is indicated by the erase-verify voltages, where a lower erase-verify voltages indicates a greater erase depth. The depth is shallower when the number of P-E cycles is less than the threshold than when the number of P-E cycles is above the threshold.

Figure 11E:
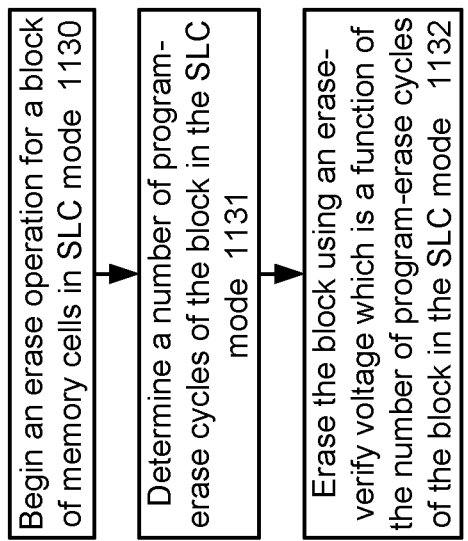
FIG. 11E depicts a flowchart of another example erase operation for SLC memory cells, consistent with FIG. 11A.

FIG. 11E depicts a flowchart of another example erase operation for SLC memory cells, consistent with FIG. 11A. Step 1130 includes beginning an erase operation for a block of memory cells in SLC mode. Such a block is designated to store data in the SLC mode after being erased. Step 1131 includes determining a number of program-erase cycles in a block in the SLC mode. This can include determining whether the number of P-E cycles is below a first threshold (e.g., P-E_th in FIG. 9A, or P-E_th1 in FIGS. 8A and 9B), or whether the number of P-E cycles is between the first threshold and a second threshold (e.g., P-E_th1 and P-E_th2 in FIG. 9B). Step 1132 includes erasing the block using an erase-verify voltage which is a function of the number of P-E cycles in the SLC mode.

For example, the erase-verify voltage is higher when the number of program-erase cycles is below the first threshold than when the number of program-erase cycles is above the first threshold. In another example, the erase-verify voltage is lower when the number of program-erase cycles for the block in the single bit per cell mode is between a second threshold (P-E_th2) and the first threshold (P-E_th1) than when the number of program-erase cycles for the block in the single bit per cell mode is below the first threshold, where the second threshold is greater than the first threshold.

Figure 12B:
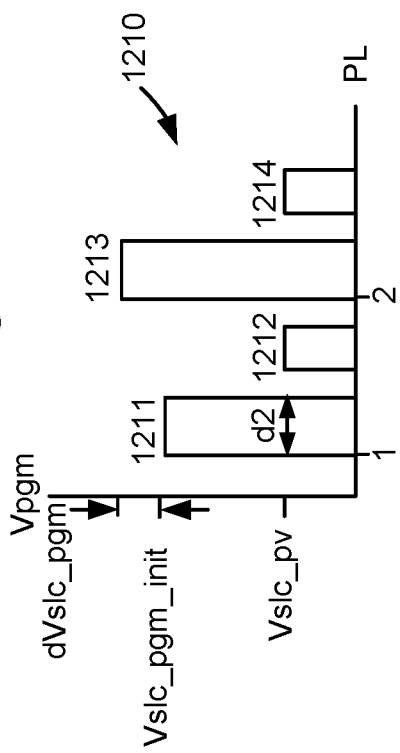
FIG. 12B depicts a plot 1210 of a voltage signal applied to a selected word line in a program operation consistent with FIGS. 11A and 11C using the default SLC program parameters of FIG. 11A, step 1105.
Figure 12A:
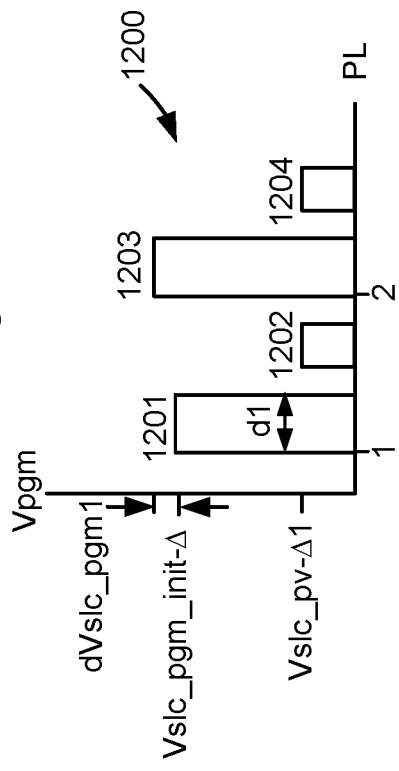
FIG. 12A depicts a plot 1200 of a voltage signal applied to a selected word line in a program operation consistent with FIGS. 11A and 11C using the modified SLC program parameters of FIG. 11A, step 1104.

FIG. 12A depicts a plot 1200 of a voltage signal applied to a selected word line in a program operation consistent with FIGS. 11A and 11C using the modified SLC program parameters of FIG. 11A, step 1104. In FIGS. 12A and 12B, the vertical axis denotes a program pulse voltage (Vpgm) and the horizontal axis denotes a program loop (PL) number.

In a first program loop, a program pulse 1201 with a magnitude of Vslc_pgm_init−Δ is applied to the selected word line, followed by a verify pulse 1202 with a magnitude of Vslc_pv−Δ1. In a second program loop, a program pulse 1203 with a magnitude of Vslc_pgm_init−Δ+dVslc_pgm1 is applied to the selected word line, followed by a verify pulse 1204 with the magnitude of Vslc_pv−Δ1. In this example, the program operation is completed in the second program loop. SLC programming generally can be completed in a relatively small number of program loops, e.g., two or more loops, compared to MLC programming, since a wider Vth distribution for the programmed state, and a larger spacing between the erased state and the programmed state, are acceptable. The program pulses can have a duration or width of d1.

FIG. 12B depicts a plot 1210 of a voltage signal applied to a selected word line in a program operation consistent with FIGS. 11A and 11C using the default SLC program parameters of FIG. 11A, step 1105. In a second program loop, a program pulse 1211 with a magnitude of Vslc_pgm_init is applied to the selected word line, followed by a verify pulse 1212 with a magnitude of Vslc_pv. In a second program loop, a program pulse 1213 with a magnitude of Vslc_pgm_init+dVslc_pgm is applied to the selected word line, followed by a verify pulse 1214 with the magnitude of Vslc_pv. The initial program voltage and step size are greater than in FIG. 12A, where the stress reduction technique is used. Also, the program pulses can have a duration of d2, which is greater than or equal to d1.

In FIG. 13A-13G, the vertical dimension denotes voltage and the horizontal dimension denotes time, with time points t0-t12. The period of time depicted corresponds to one program loop or program-verify iteration and includes a pre-charge phase 1311 (t0-t2), a program phase 1312 (t2-t4), a recovery phase 1313 (t4-t9) and a verify phase 1314 (t9-t12). The voltages depicted are examples.

Figure 13A:
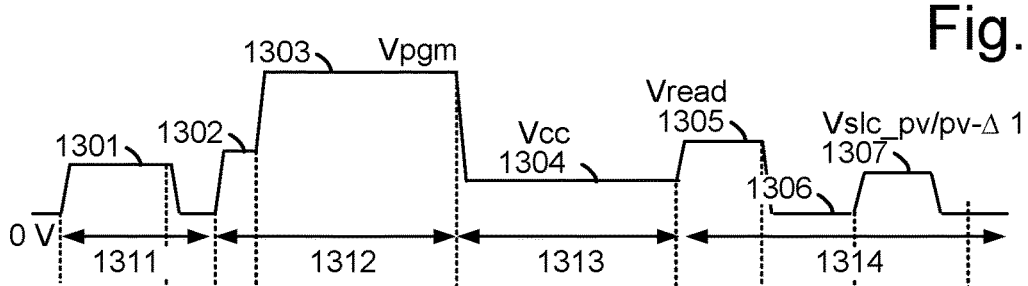
FIG. 13A depicts voltages applied to a selected word line, WLn in a program loop of a program operation in a SLC mode, consistent with FIG. 12A or 12B.

FIG. 13A depicts voltages applied to a selected word line, WLn in a program loop of a program operation in a SLC mode, consistent with FIG. 12A or 12B.

In the pre-charge phase, a plot 1301 represents a turn on voltage, e.g., 6 V, for the memory cells.

In the program phase, a plot 1302 represents a program pass voltage, Vpass, and a plot 1303 represents a program level of Vpgm.

In the recovery phase, a plot 1304 represents a positive recovery voltage of Vcc=3 V. In the verify phase, a plot 1305 represents a voltage pulse at Vread. This helps equalize the channel potential. The voltage is then reduced to, e.g., 0 V at plot 1306 and increased to Vslc_pv (default program-verify voltage) or Vslc_pv−Δ1 (modified program-verify voltage) at plot 1307.

During the application of the verify voltage, a sensing operation occurs for the memory cells which are assigned to the programmed state. The selected memory cells are connected to a selected word line, and can be in a selected sub-block.

Figure 13B:
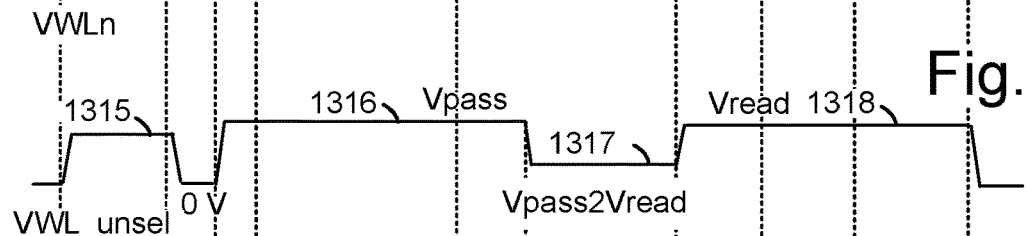
FIG. 13B depicts a voltage, VWL_unsel, applied to unselected word lines, consistent with FIG. 13A.

FIG. 13B depicts a voltage, VWL_unsel, applied to unselected word lines, consistent with FIG. 13A. A plot 1315 represents a turn on voltage such as 6 V, a plot 1316 represents Vpass=8 V, a plot 1317 represents Vpass2Vread and a plot 1318 represents Vread, e.g., 8 V.

Figure 13C:
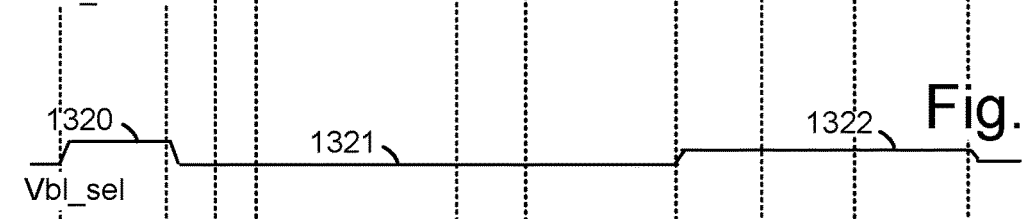
FIG. 13C depicts a voltage, Vbl_sel, applied to bit lines of programmed NAND strings, consistent with FIG. 13A.

FIG. 13C depicts a voltage, Vbl_sel, applied to bit lines of programmed NAND strings, consistent with FIG. 13A. A plot 1320 represents a pre-charge voltage of, e.g., 1 V, a plot 1321 represents 0.5 V, and a plot 1322 represents Vsense=0.8 V.

Figure 13D:
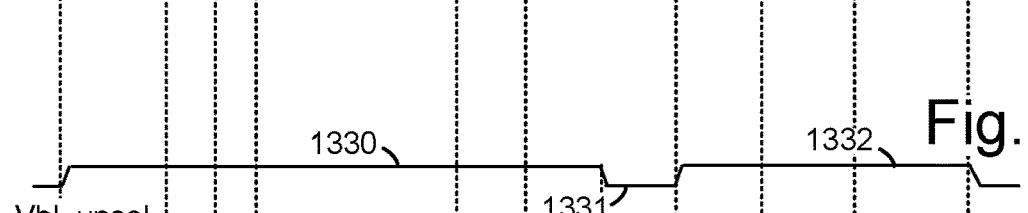
FIG. 13D depicts a voltage, Vbl_unsel, applied to bit lines of unselected NAND strings, consistent with FIG. 13A.

FIG. 13D depicts a voltage, Vbl_unsel, applied to bit lines of unselected NAND strings, consistent with FIG. 13A. These are unselected NAND strings in a selected sub-block which will be inhibited from programming. A plot 1330 represents 2 V in the pre-charge and program phases, a plot 1331 represents 0 V in the recovery phase and a plot 1332 represents 2 V in the verify phase.

Figure 13E:
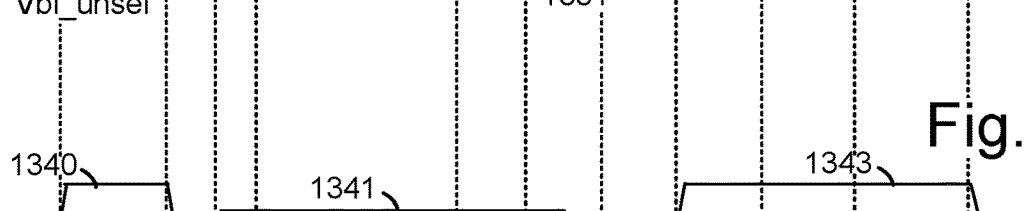
FIG. 13E depicts a voltage, Vsgd_sel, applied to SGD transistors of a selected sub-block, consistent with FIG. 13A.

FIG. 13E depicts a voltage, Vsgd_sel, applied to SGD transistors of a selected sub-block, consistent with FIG. 13A. A plot 1340 represents 8 V, a plot 1341 represents 2.5 V, a plot 1342 represents 0 V and a plot 1343 represents 8 V.

Figure 13F:
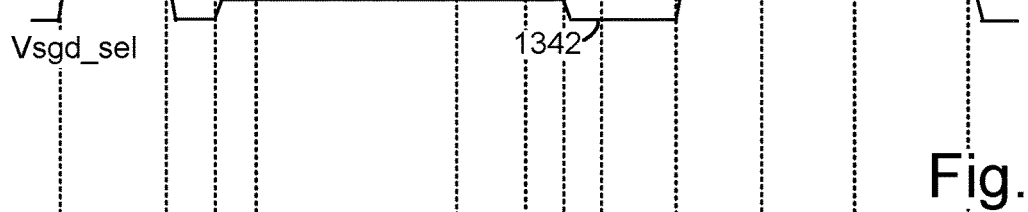
FIG. 13F depicts voltages applied to SGD transistors of unselected sub-blocks and to SGS transistors, consistent with FIG. 13A.

FIG. 13F depicts voltages applied to SGD transistors of unselected sub-blocks and to SGS transistors, consistent with FIG. 13A. A plot 1350 represents 8 V and a plot 1354 represents 0 V for Vsgs and Vsgd_unsel, respectively. A plot 1351 represents 0 V for both Vsgs and Vsgd_unsel. A plot 1352 represents 8 V for Vsgs and a plot 1353 represents 0 V for Vsgd_unsel.

Figure 13G:
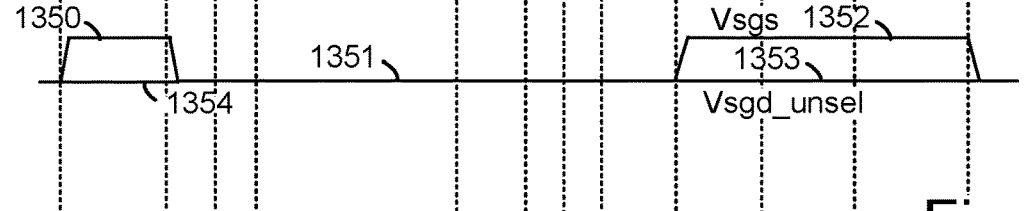
FIG. 13G depicts a voltage applied to a source line, consistent with FIG. 13A.

FIG. 13G depicts a voltage applied to a source line, consistent with FIG. 13A. A plot 1360 represents a pre-charge voltage such as 1 V, a plot 1361 represents 0 V and a plot 1362 represents 1 V.

In the pre-charge phase, a positive inhibit voltage (plot 1330) is provided to the drain-side channels of the unselected NAND strings to remove residue electrons and to provide a small amount of boosting such as 1-2 V. The SGD transistors of the selected and unselected sub-blocks are in a conductive state at this time, with a voltage of 8 V, for example. This allows the bit line voltage to be passed to the drain end channel. It is also possible for the SGS transistors of the selected and unselected sub-blocks to be in a conductive state at this time, with a voltage of 8 V, for example to allow Vsl to be passed to the source end of the channel. The plot 1331 represents Vbl_unsel returning to 0 V in part of the recovery phase, and the plot 1332 represents Vbl_unsel at 2 V during the verify phase, for example.

In the program phase, VWLn and Vwl_unsel are ramped up to Vpass, e.g., starting at t2, to provide a capacitive coupling up of the channels of the unselected NAND strings. VWLn is then ramped up further at t3 to the one or more program levels and held at Vpgm_L2 until t4. After the application of the program pulse, the word line voltages are ramped down in the recovery phase. Subsequently, in the verify phase, a verify test is performed by applying VvP on WLn and sensing the conductive state of the memory cells in the programmed NAND strings of the selected sub-block. Before the verify tests, VWLn is ramped up with VWL_unsel to Vread to equalize the channel potential.

During the program pulse, Vsgd_sel is high enough to provide the selected SGD transistors in a conductive state (a turn on state) for the programmed NAND strings, which receive Vbl_sel=0 V, but low enough to provide the selected SGD transistors in a non-conductive state for the unselected NAND strings, which receive Vbl_unsel=2 V.

During the verify phase, the SGD and SGS transistors are in a strongly conductive state to allow sensing to occur for the selected memory cells.

FIG. 14 depicts an example voltage signal 1450 in an MLC program operation, consistent with FIG. 11A, step 1106. QLC programming, with four bits per cell, and sixteen data states, is provided as an example. Other types of MLC programming can be used. In this example, the voltage signal includes twenty program loops PL1-PL20 with program pulses 1410-1429, respectively, and associated verify voltages. For example, verify voltages (plot 1430) are provided in PL1. The verify voltages are depicted in a simplified form, and can be provided for progressively higher data states as the programming proceeds.

The voltages signals for programming in the MLC mode are similar to those in the SLC mode as depicted in FIG. 13A-13G, except the verify voltages are for the programmed MLC states. Multiple verify voltages can be used in one program loop.

FIG. 15A depicts an example of latch data during SLC programming, consistent with FIG. 8A or 8B. In this example, a "1" bit denotes a memory cell which is to remain in the erased state and a "0" bit denotes a memory cell which is to be programmed to the P state.

FIG. 15B depicts an example of latch data during MLC programming, with four data states, consistent with FIG. 8C. The LP/UP bits are 1/1 for the Er state, 1/0 for the A state, 0/1 for the B state and 0/0 for the C state.

FIG. 15C depicts an example of latch data during MLC programming, with eight data states, consistent with FIG. 8D. The LP/MP/UP bits are 1/1/1 for the Er state, 1/1/0 for the A state, 1/0/1 for the B state, 1/0/0 for the C state, 0/1/1 for the D state, 0/1/0 for the E state, 0/0/1 for the F state and 0/0/0 for the G state.

FIG. 15D depicts an example of latch data during MLC programming, with sixteen data states, consistent with FIG. 8E. In this example, the LP/LMP/UMP/UP latches store 1/1/1/1, 0/0/0/0, 1/0/0/0, 0/1/0/0, 1/1/0/0, 0/0/1/0, 1/0/1/0, 0/1/1/0, 1/1/1/0, 0/0/0/1, 1/0/0/1, 0/1/0/1, 1/1/0/1, 0/0/1/1, 1/0/1/1, and 0/1/1/1 for the S0/Er-S15 data states, respectively.

Figure 16A:
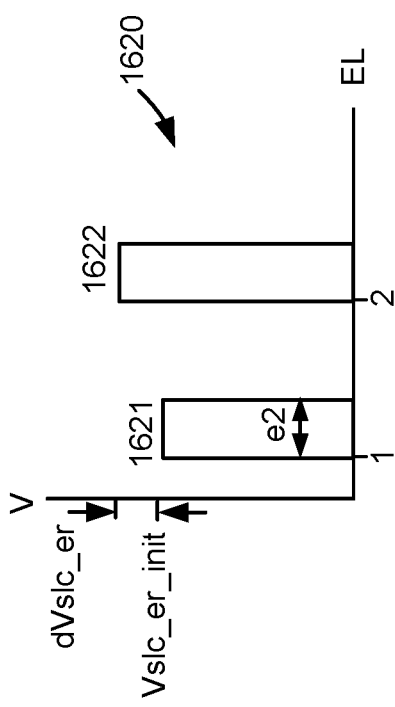
FIG. 16A depicts a plot 1600 of erase pulses applied to a block in an erase operation consistent with FIGS. 11A and 11D using the modified SLC erase parameters of FIG. 11A, step 1104.
Figure 16B:
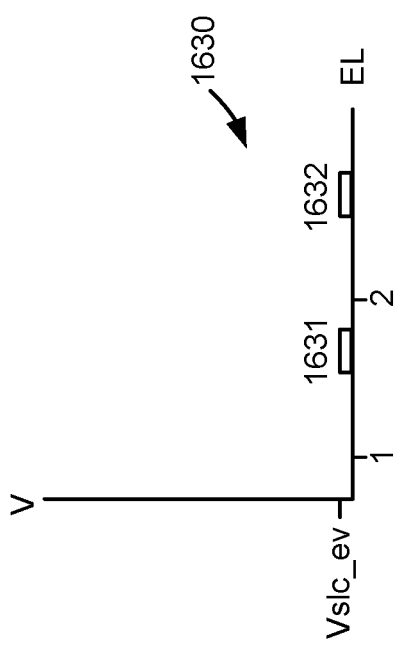
FIG. 16B depicts a plot 1610 of erase-verify voltages applied to a block in an erase operation consistent with FIG. 16A.
Figure 16C:
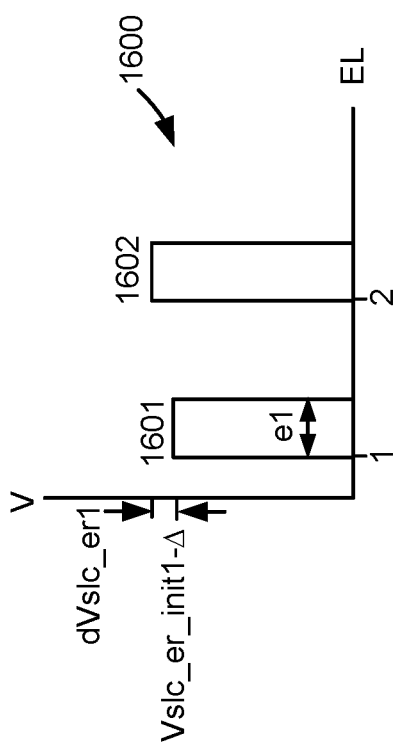
FIG. 16C depicts a plot 1620 of erase pulses applied to a block in an erase operation consistent with FIGS. 11A and 11D using the default SLC erase parameters of FIG. 11A, step 1105.
Figure 16D:
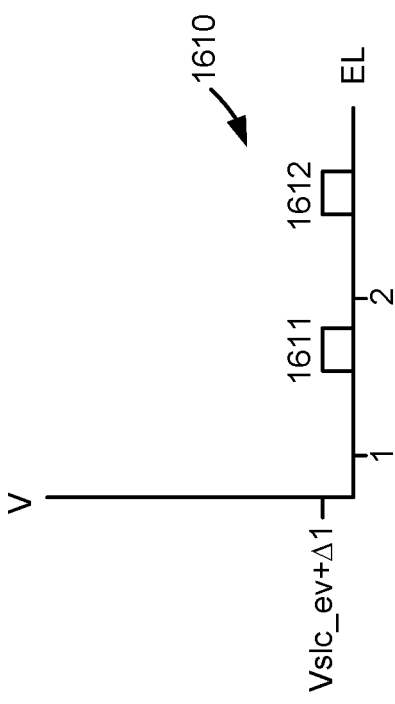
FIG. 16D depicts a plot 1630 of erase-verify voltages applied to a block in an erase operation consistent with FIG. 16C.

In FIGS. 16A and 16C, the vertical axis denotes an erase pulse voltage and the horizontal axis denotes an erase loop (EL) number. In FIGS. 16B and 16D, the vertical axis denotes an erase-verify voltage and the horizontal axis denotes the EL number.

An erase operation typically has multiple erase-verify loops or iterations. Each loop has an erase portion in which an erase pulse is applied to charge up the NAND string channels, and a verify portion in which an erase-verify test is performed for the memory cells to determine whether their Vth has decreased below an erase-verify level. In one approach, the channels can be charged up by applying the erase pulse to the substrate to introduce holes into the channels from in the substrate. In another approach, the channels can be charged up by biasing the SGS and/or SGD transistors to generate holes in the channels by gate induced drain leakage (GIDL). In this approach, the erase pulse is applied to the source line and/or bit lines.

FIG. 16A depicts a plot 1600 of erase pulses applied to a block in an erase operation consistent with FIGS. 11A and 11D using the modified SLC erase parameters of FIG. 11A, step 1104. In a first erase loop, an initial erase pulse 1601 with a magnitude of Vslc_er_init−Δ is applied to the block. In a second erase loop, an erase pulse 1602 with a magnitude of Vslc_er_init−Δ+dVslc_er1 is applied to the block. dVslc_er1 is an erase pulse step size. The erase pulses can have a duration or width of e1. In this example, the erase operation is completed in the second erase loop. SLC and MLC erasing generally can be completed in a relatively small number of erase loops, e.g., two or more loops.

Each erase pulse can be followed by an erase-verify voltage such as depicted in FIGS. 16B and 16D.

FIG. 16B depicts a plot 1610 of erase-verify voltages applied to a block in an erase operation consistent with FIG. 16A. In the first erase loop, an erase-verify voltage (plot 1611) with a magnitude of Vslc_ev+Δ1 is applied to the word lines in the block. In one approach, all word lines are verified at the same time. In another approach, the odd-numbered word lines are verified separately from the even-numbered word lines. In the second erase loop, an erase-verify voltage (plot 1612) with the magnitude of Vslc_ev+Δ1 is applied to the word lines.

FIG. 16C depicts a plot 1620 of erase pulses applied to a block in an erase operation consistent with FIGS. 11A and 11D using the default SLC erase parameters of FIG. 11A, step 1105. In a first erase loop, an erase pulse (plot 1621) with a magnitude of Vslc_er_init is applied to the block. In a second erase loop, an erase pulse (plot 1622) with a magnitude of Vslc_er_init+dVslc_er is applied to the block. dVslc_er is an erase pulse step size which is greater than dVslc_er1. The initial erase voltage and step size are greater than in FIG. 16A, where the stress reduction technique is used. Also, the erase pulses can have a duration of e2, which is greater than or equal to e1.

FIG. 16D depicts a plot 1630 of erase-verify voltages applied to a block in an erase operation consistent with FIG. 16C. In the first erase loop, an erase-verify voltage (plot 1631) with a magnitude of Vslc_ev is applied to the word lines in the block. In the second erase loop, an erase-verify voltage (plot 1632) with a magnitude of Vslc_ev is applied to the word lines. The erase-verify voltage is less than in FIG. 16B, where the stress reduction technique is used.

Figure 17:
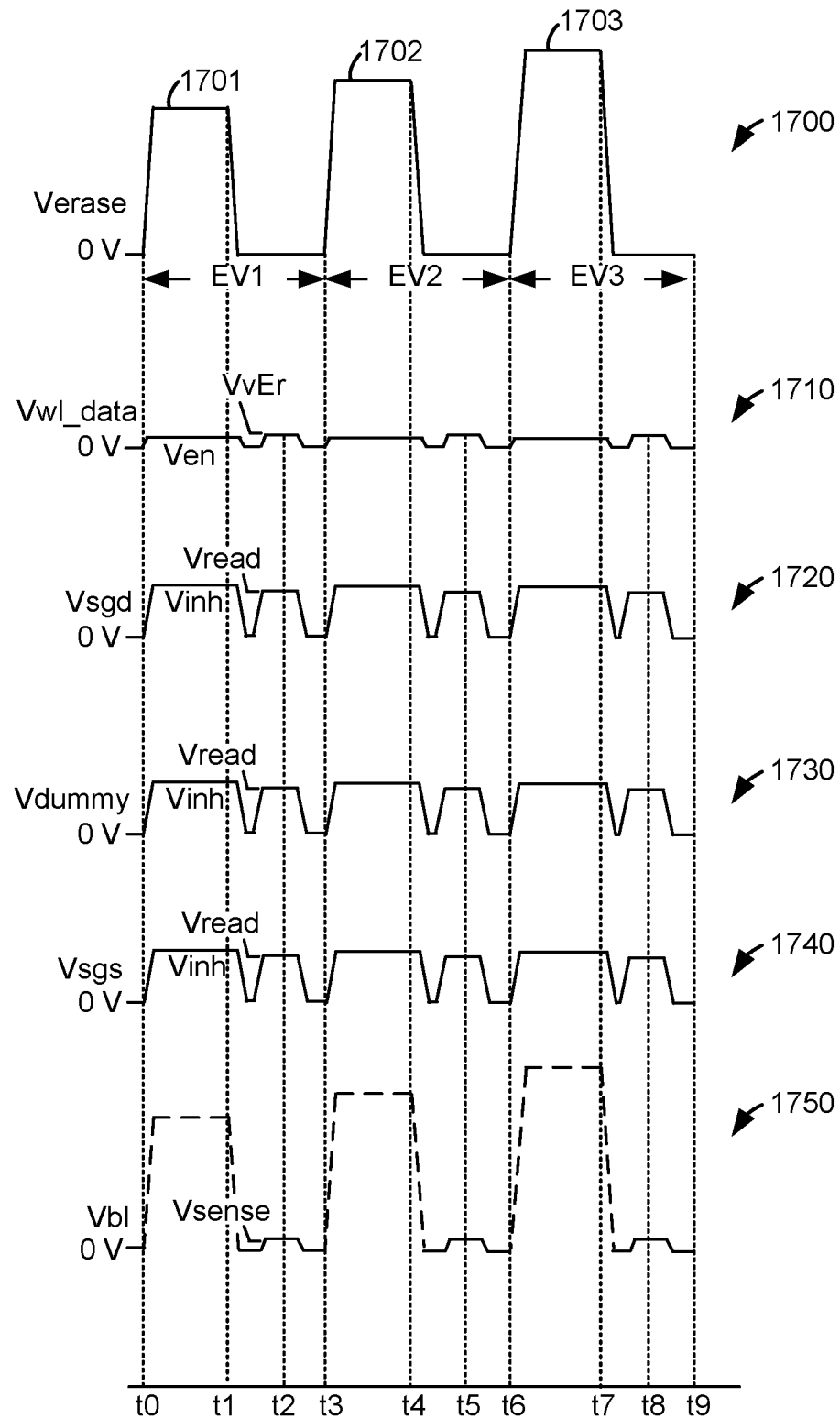
FIG. 17 depicts example voltage signals of an erase operation for MLC memory cells, consistent with FIGS. 11A and 11D.

FIG. 17 depicts example voltage signals of an erase operation for MLC memory cells, consistent with FIGS. 11A and 11D. The voltage signals extend over time points t0-t9. The vertical direction indicates voltage, and the horizontal direction indicates time. In this example, the erase operation has three erase-verify loops, EV1-EV3. An erase operation typically has multiple erase-verify loops. Each loop has an erase portion in which an erase pulse is applied to charge up the NAND string channels. The erase portion is followed by a verify portion which can include an erase-verify test for the memory cells.

A voltage signal 1700 depicts Verase including erase pulses 1701-1703. The first, second and third erase pulses are at t0-t1, t3-t4 and t6-t7, respectively. The erase voltage can involve a transition from 0 V to a peak voltage, e.g., 15-25 V, which is stepped up in successive erase-verify iterations after the first erase-verify iteration. The channel voltage of the NAND strings will be similar to, and slightly less than, Verase. In this example, the erase pulse is applied to the p-well.

A voltage signal 1710 depicts a voltage applied to the data word lines, Vwl_data. This voltage signal increases from 0 V to Ven during each erase pulse. Ven is an erase-enable voltage such as 0-0.5 V. Between the erase pulses, in the verify portion of the erase-verify loops, Vwl_data is set to an erase-verify voltage, VvEr, such as 0 V, at which time a sensing operation (verify test) occurs. The sensing occurs at t2, t5 and t8. In the modified SLC mode, VvEr=Vslc_ev+Δ1. In the default SLC mode, VvEr=Vslc_ev. In the MLC mode, VvEr is consistent with FIG. 8C-8E.

A voltage signal 1720 depicts a voltage applied to the SGD transistors, Vsgd. This voltage signal increases from 0 V to Vinh, an inhibit voltage, during each erase pulse. In the verify portion of the erase-verify loops, Vsgd is set to Vread. Vinh is an erase-inhibit voltage such as 10 V, and Vread is a read pass voltage such as 8-10 V. As mentioned, the verify test can be performed for all word lines of a block concurrently. Or, a verify test for the odd-numbered word lines can be separate from a verify test for the even-numbered word lines.

A voltage signal 1730 depicts a voltage applied to dummy word lines. This voltage signal increases from 0 V to Vinh during each erase pulse. In the verify portion of the erase-verify loops, Vdummy is set to Vread.

A voltage signal 1740 depicts a voltage applied to the SGS transistors, Vsgs. This voltage signal increases from 0 V to Vinh during each erase pulse. In the verify portion of the erase-verify loops, Vsgs is set to Vread.

A voltage signal 1750 depicts a voltage of the bit lines. The bit line voltage Vbl increases as the channel voltage increases, in concert with Verase. The dashed lines denote a floating voltage. In the verify portion of the erase-verify loops, Vbl is set to Vsense, a sensing voltage of the bit line such as 0.8 V.

Accordingly, it can be seen that, in an example implementation, an apparatus comprises a control circuit configured to connect to a set of memory cells in a block. The control circuit is configured to: determine whether a number of program-erase cycles for the block in a single bit per cell mode is below a first threshold; and erase the set of memory cells using an erase-verify voltage which is a function of whether the number of program-erase cycles for the block in the single bit per cell mode is below the first threshold, the erase-verify voltage is higher when the number of program-erase cycles for the block in the single bit per cell mode is below the first threshold than when the number of program-erase cycles for the block in the single bit per cell mode is above the first threshold.

In another example implementation, a method comprises erasing a set of memory cells in a block using an erase-verify voltage, the erase-verify voltage is higher when a number of program-erase cycles for the block is below a first threshold than when the number of program-erase cycles for the block is above the first threshold; and programming the set of memory cells using a program-verify voltage, the program-verify voltage is lower when the number of program-erase cycles for the block is below the first threshold than when the number of program-erase cycles for the block is above the first threshold.

In another implementation, an apparatus comprises a block of memory cells; a control circuit configured to connect to the block of memory cells; and a memory interface connected to the control circuit. The control circuit is configured to issue a command via the memory interface to: erase the block of memory cells using a plurality of erase pulses, a magnitude of an initial erase pulse of the plurality of erase pulses is lower when a number of program-erase cycles for the block in a single bit per cell mode is below a first threshold, than when the number of program-erase cycles for the block in the single bit per cell mode is above the first threshold.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a set of memory cells in a block, the control circuit is configured to:
determine whether a number of program-erase cycles for the block in a single bit per cell mode is below a first threshold; and
erase the set of memory cells using an erase-verify voltage which is a function of whether the number of program-erase cycles for the block in the single bit per cell mode is below the first threshold, the erase-verify voltage is higher and an initial erase pulse has a lower magnitude when the number of program-erase cycles for the block in the single bit per cell mode is below the first threshold than when the number of program-erase cycles for the block in the single bit per cell mode is above the first threshold; and
program the set of memory cells using a program-verify voltage, the program-verify voltage is lower when the number of program-erase cycles for the block is below the first threshold than when the number of program-erase cycles for the block is above the first threshold.

2. The apparatus of claim 1, wherein the control circuit is configured to:
erase the block with a modified erase pulse step size when the number of program-erase cycles for the block in the single bit per cell mode is below the first threshold; and
erase the set of memory cells with a default erase pulse step size, greater than the modified erase pulse step size, when the number of program-erase cycles for the block in the single bit per cell mode is above the first threshold.

3. The apparatus of claim 1, wherein:
the erase-verify voltage is lower when the number of program-erase cycles for the block in the single bit per cell mode is between a second threshold and the first threshold than when the number of program-erase cycles for the block in the single bit per cell mode is below the first threshold, the second threshold is greater than the first threshold.

4. The apparatus of claim 1, wherein:
the first threshold is no more than 5% of a number of program-erase cycles for the block in the single bit per cell mode in a lifetime of the block.

5. The apparatus of claim 1, wherein:
when the block is in a multiple bit per cell mode, the control circuit is configured to erase the set of memory cells using an erase-verify voltage which is independent of a number of program-erase cycles for the block in the multiple bit per cell mode.

6. The apparatus of claim 1, wherein:
when the block is in a multiple bit per cell mode, the control circuit is configured to program the set of memory cells using a program-verify voltage which is independent of a number of program-erase cycles for the block in the multiple bit per cell mode.

7. The apparatus of claim 1, wherein the control circuit is configured to:
program the set of memory cells using a plurality of program pulses, a voltage of an initial pulse of the plurality of pulses is lower when the number of program-erase cycles for the block in the single bit per cell mode is below the first threshold than when the number of program-erase cycles for the block in the single bit per cell mode is above the first threshold.

8. A method, comprising:
erasing a set of memory cells in a block using an erase-verify voltage, the erase-verify voltage is higher and an initial erase pulse has a lower magnitude when a number of program-erase cycles for the block is below a first threshold than when the number of program-erase cycles for the block is above the first threshold; and
programming the set of memory cells using a program-verify voltage, the program-verify voltage is lower when the number of program-erase cycles for the block is below the first threshold than when the number of program-erase cycles for the block is above the first threshold.

9. The method of claim 8, further comprising:
subsequently reconfiguring the block for a multiple bit per cell mode; and
while the block is in the multiple bit per cell mode, programming the set of memory cells using a program-verify voltage which is independent of a number of program-erase cycles for the block.

10. The method of claim 8, wherein:
during the erasing of the set of memory cells, an erase pulse step size is lower when the number of program-erase cycles for the block is below the first threshold than when the number of program-erase cycles for the block is above the first threshold.

11. The method of claim 8, wherein:
the erasing and the programming occur while the set of memory cells is in a single bit per cell mode; and
the number of program-erase cycles for the block is a number of program-erase cycles in a single bit per cell mode of the block.

12. The method of claim 8, wherein:
the first threshold is no more than 5% of a number of program-erase cycles for the block in a lifetime of the block.

13. The method of claim 8, wherein:
during the programming of the set of memory cells, an initial program pulse has a lower magnitude when the number of program-erase cycles for the block is below the first threshold than when the number of program-erase cycles for the block is above the first threshold.

14. An apparatus, comprising:
a block of memory cells;
a control circuit configured to connect to the block of memory cells; and
a memory interface connected to the control circuit, the control circuit is configured to issue commands via the memory interface to:
erase the block of memory cells using a plurality of erase pulses to charge up channels of the block of memory cells and an erase-verify voltage to verify erase, a magnitude of an initial erase pulse of the plurality of erase pulses is lower and the erase-verify voltage is higher when a number of program-erase cycles for the block in a single bit per cell mode is below a first threshold, than when the number of program-erase cycles for the block in the single bit per cell mode is above the first threshold; and
program the set of memory cells using a program-verify voltage, the program-verify voltage is lower when the number of program-erase cycles for the block is below the first threshold than when the number of program-erase cycles for the block is above the first threshold.

15. The apparatus of claim 14, wherein:
a step size of the plurality of erase pulses is lower when the number of program-erase cycles for the block in the single bit per cell mode is below the first threshold, than when the number of program-erase cycles for the block in the single bit per cell mode is above the first threshold.

16. The apparatus of claim 14, wherein:
the control circuit is configured to issue a command via the memory interface to verify whether the block of memory cells is erased using the erase-verify voltage.

17. The apparatus of claim 14, wherein:
the control circuit is configured to issue a command via the memory interface to program a set of memory cells in the block of memory cells using a plurality of program pulses; and
a magnitude of an initial program pulse of the plurality of program pulses is lower when a number of program-erase cycles for the block in a single bit per cell mode is below a first threshold, than when the number of program-erase cycles for the block in the single bit per cell mode is above the first threshold.

18. The apparatus of claim 14, wherein:
the control circuit is configured to issue a command via the memory interface to program a set of memory cells in the block of memory cells using a plurality of program pulses; and
a step size of the plurality of program pulses is lower when the number of program-erase cycles for the block in the single bit per cell mode is below the first threshold, than when the number of program-erase cycles for the block in the single bit per cell mode is above the first threshold.

19. The apparatus of claim 14, wherein:
the control circuit is configured to issue a command via the memory interface to program a set of memory cells in the block of memory cells using the program-verify voltage.

20. The apparatus of claim 14, wherein the first threshold is no more than 5% of a number of program-erase cycles for the block in a lifetime of the block.

\* \* \* \* \*